(12) United States Patent
Morris et al.

(10) Patent No.: US 9,117,523 B1
(45) Date of Patent: Aug. 25, 2015

(54) CHAINLINK MEMORY

(71) Applicants: Daniel H. Morris, Pittsburgh, PA (US); David M. Bromberg, Pittsburgh, PA (US); Lawrence T. Pileggi, Pittsburgh, PA (US); Jiam-Gang (Jimmy) Zhu, Pittsburgh, PA (US)

(72) Inventors: Daniel H. Morris, Pittsburgh, PA (US); David M. Bromberg, Pittsburgh, PA (US); Lawrence T. Pileggi, Pittsburgh, PA (US); Jiam-Gang (Jimmy) Zhu, Pittsburgh, PA (US)

(73) Assignee: Iron City Integrated Circuits, Pittsburgh, PA (US)

( * ) Notice: Subject to any disclaimer, the term of this patent is extended or adjusted under 35 U.S.C. 154(b) by 296 days.

(21) Appl. No.: 13/649,989

(22) Filed: Oct. 11, 2012

Related U.S. Application Data

(60) Provisional application No. 61/641,296, filed on May 1, 2012.

(51) Int. Cl.
    *G11C 19/00* (2006.01)
    *G11C 19/02* (2006.01)

(52) U.S. Cl.
    CPC ..................... *G11C 19/02* (2013.01)

(58) Field of Classification Search
    USPC ......... 365/48, 55, 62, 66, 74, 78, 80–93, 100, 365/130, 131, 148, 158, 171–173, 209, 213, 365/225.5, 230.07, 232, 243.5; 257/295, 257/421, E21.665; 438/3; 977/933–935
    See application file for complete search history.

(56) References Cited

U.S. PATENT DOCUMENTS

| | | | |
|---|---|---|---|
| 2009/0296454 A1* | 12/2009 | Honda et al. | 365/158 |
| 2010/0193889 A1* | 8/2010 | Nagahara et al. | 257/421 |
| 2010/0193890 A1* | 8/2010 | Suzuki et al. | 257/421 |
| 2011/0260273 A1* | 10/2011 | Fukami et al. | 257/421 |
| 2012/0206959 A1* | 8/2012 | Honda et al. | 365/171 |
| 2014/0241030 A1* | 8/2014 | Fukuzumi et al. | 365/80 |

OTHER PUBLICATIONS

D.M. Bromberg, et al., "All-Magnetic, Nonvolatile, Addressable Chainlink Memory," IEEE Trans. on Magnetics, vol. 49, Issue 7, Jul. 15, 2013.

* cited by examiner

*Primary Examiner* — Harry W Byrne
(74) *Attorney, Agent, or Firm* — David Garrod

(57) ABSTRACT

A nonvolatile alternative to DRAM or Flash is disclosed. It involves a new "magnetic shift register" that avoids the bit annihilation problem that plagues magnetic racetrack memories. Using this new "chainlink memory" approach, one avoids the annihilation problem inherent in racetrack memory by breaking up the racetrack into magnetically coupled links, where each link preferably handles one bit exclusively. Depending upon the implementation, the "bit" can be, for example, the magnetization of a link, presence or absence of a domain wall, or the polarity of a domain wall. Numerous examples and applications of this new chainlink technology are disclosed.

26 Claims, 34 Drawing Sheets

CHAINLINK MEMORY

CROSS-REFERENCE TO RELATED APPLICATION

This application claims priority from U.S. provisional application Ser. No. 61/641,296, "Chainlink Memory," filed May 1, 2012 by the inventors herein, which provisional application is incorporated into the present application by reference.

BACKGROUND

In recent years, a magnetic shift register termed "racetrack memory" has come into the spotlight as a dense memory technology. Racetrack memory operates by pushing magnetic domain walls (i.e., the "walls" that define regions of opposing magnetization in a magnetic material) along a track composed of a magnetic wire. In some prior art devices, stable domain wall positions are created by adding "notches" along a track. In racetrack memories, the domain wall shifting mechanism is believed to be spin-transfer torque (STT), where a spin-polarized input current imparts a torque on local magnetic moments, causing them to align in the direction of the electron spin. FIG. 1 (adapted from FIG. 4A of U.S. Pat. No. 7,551,469, incorporated by reference herein) shows an exemplary, prior art 2D racetrack memory. The bits of this racetrack memory are read out serially via a magnetic sensor, such as a magnetic tunnel junction (MTJ) or giant magnetoresistive (GMR) stack, positioned somewhere along the chain. 3D versions of such structures have been proposed, but the fabrication process is prohibitively complex.

While racetrack memory remains a potentially interesting technology that might have commercial value in the future, there are numerous problems that impede its commercial deployment today. Racetrack memories are complicated to control, requiring precise timing and pulse generation to move the domain walls along the track simultaneously and at the appropriate speed, as well as having them stop in the low energy positions. Most importantly, however, adjacent domain walls in the track—effectively the bits of data—occasionally annihilate each other during motion. This annihilation of domain walls represents a loss of data in the memory.

A principal objective of the present invention is to enable a nonvolatile alternative to DRAM or Flash. As discussed in greater detail below, this objective is achieved, at least in part, through use of a new "magnetic shift register" that avoids the bit annihilation problem that plagues racetrack memories.

SUMMARY OF THE INVENTION

A key aspect of the invention relates to a shift register-like memory system that we refer to generally as chainlink memory. With chainlink memory, we avoid the annihilation problem inherent in racetrack memory by breaking up the racetrack into magnetically coupled links, where each link preferably handles one bit exclusively. The "bit" can be, for example, in the form of magnetization of a link, presence or absence of a domain wall, or the polarity of a domain wall.

The bitcell links can be distinguished as physically separate structures, or alternatively, the bitcell links can be distinguished by material or structural changes to a larger, common structure. For example, bitcell link boundaries can be distinguished by the creation of preferential pinning regions that prevent the propagation of a domain wall past the pinning region boundaries. One way that this can be done is to add a conductive path in parallel with the magnetic material to shunt current away from the magnetic material and prevent the current from propagating the domain wall.

The concepts underlying chainlink memory are best illustrated with reference to the exemplary embodiment depicted in FIGS. 2A-D. In this exemplary embodiment, the racetrack is broken into a plurality of electrically-insulated, magnetically-coupled links, forming a chain (FIG. 2A). A subset of these links are serially-connected by non-magnetic conductors, forming a conductive path. Two conductive paths are arranged so that the ends of the links in one path overlap with the ends of those in the other; an electrically-insulating magnetic material mediates coupling in these overlap regions (the insulator may be, for example, broken up with the links [FIG. 2A] or remain a continuous film [FIG. 2E]). Each path is driven by a unique phase of current, which will move DWs along the links in that path by STT (or other switching effect, e.g., Rashba effect) and into the coupling sites. Once a wall propagates through the coupling site, it moves fully into the next link in the other path. Once there, it no longer continues to propagate because the driving current in that path is off, and an energy barrier exists for the wall to enter the next link due to the increased wall cross-sectional area at the output site. Only when the current in that path is activated will the domain wall be able to continue propagating. For example, the energy of an ideal 180-degree Bloch wall is given by:

$$E_{DW} = 4\sqrt{AK} \times (\text{Area})$$

where A is the exchange stiffness of the material in erg/cm and K the anisotropy strength in erg/cm$^3$. Note that while the energy of a Bloch wall is minimized when the cross-sectional area is smaller, other types of domain walls exist where the energy is minimized when the area is larger (e.g., vortex domain walls). Variants of the present invention can be made with these types of domain walls if the link structure is designed such that the coupling sites have smaller cross-sectional area than the other regions.

In this example, each magnetic link has an input-coupling region, a trapping region, and an output-coupling region. The input and output coupling regions are distinguished by magnetic coupling to the previous and subsequent links in the chain, the trapping region is bounded by an energy barrier to domain wall propagation.

The operation of this exemplary chainlink memory is described as follows: Consider the exemplary structure depicted in FIG. 2B. (The electric contacts are omitted for simplicity, but it is implied that each link is driven by a separate phase of current pulse.) The initial magnetization state is shown, with a domain wall resting in Region 2. An input current pulse ("Clock A") enters the top link (FIG. 2C). The spins of electrons constituting this current are spin-polarized by Region 1, a magnetic region with magnetization drawn downward in the figure. The spin-polarized electrons leaving Region 1 enter Region 2 and, by the STT [spin-transfer torque] effect, move the domain wall along Region 2 and program its magnetization downward. With a current of sufficient magnitude, the domain wall will then enter Region 3, and STT will drive its magnetization downward as well. (Of course, the invention can also operate with materials in which the polarity of the current-induced domain wall movement is inverted, or where the motion is caused by an effect other than STT, as those skilled in the art will appreciate.) The second link is positioned below an insulator, such that the predominance of the current on Clock A does not enter the second link.

An important feature of this exemplary chainlink memory (e.g., one which distinguishes it from racetrack memory) is that the next bit position is not along the same track; instead, the magnetization just programmed in Region 3 couples to an independent link and programs the magnetization of Region 4. Thus, using the one pulse of current on Clock A, we have effectively propagated the "bit" (here, the magnetization direction) in Region 1 up to Region 4. A second current pulse on some non-overlapping Clock B can then repeat this process in the bottom link. FIG. 2D shows the end result of this process. With two-phase clocking applied, a "bitcell" in this exemplary chainlink memory structure consists of two coupled links. Each activation pulse can only move a bit a single position. This controllability allows for design margin. Though two phases of activation pulses are preferred for bit propagation, three, four, or more phases can work as well.

FIG. 3 shows a longer chain that further illustrates chainlink memory operation. Here, we have electrically-connected every other link for two-phase current control. On each current pulse of phase-1, the domain walls in the lower links are moved to propagate every other bit to the upper links via magnetic coupling; on current phase-2, the bits in the upper links are propagated to the lower links, shifting that data along the chain. The two-phase current control and electrically-insulated structures prevents domain wall annihilation entirely. In a full chainlink structure, either another link or a write device (described later) would couple to the first link shown, and further links would lengthen the chain from the last links shown. The storage positions are illustratively labeled for every two links. This is appropriate here because if a read sensor is placed under a particular coupling site, it will only see a new bit on every pulse of one phase of clock. As such, it takes two current pulses—one from each phase—to push a bit to the sensor.

Accordingly, generally speaking, and without intending to be limiting, one aspect of the invention relates to race-free shift registers comprised of, for example, the following: a plurality of odd-numbered storage elements, including at least $1^{st}$, $3^{rd}$, and $5^{th}$ storage elements, each capable of switching between first and second states; a plurality of even-numbered storage elements, including at least $2^{nd}$, $4^{th}$, and $6^{th}$ storage elements, each also capable of switching between said first and second states; each of said storage elements including an input-coupling region [e.g., FIG. 2A, portion of element 21 that overlaps element 23 or FIG. 2B, Region 2 (for vertical chainlink) or FIG. 15, portion of element portion of 157 that lies above 159 (for lateral chainlink)] capable of assuming at least first and second states [e.g., FIG. 2B, up and down magnetization arrows], a trapping region [e.g., FIG. 2A, portion of element 21 that does not overlap element 23 or element 27 (for vertical chainlink) or FIG. 15, portion of element 159 that does not overlap elements 157 or 158 (for lateral chainlink)] capable of assuming at least said first and second states, and at least one sensitization terminal [e.g., FIG. 2A, portion of element 21 that abuts element 20 (for vertical chainlink) or FIG. 15, portion of element 159 that abuts element 151 (for lateral chainlink)] configured to receive an activation excitation that causes said storage region to assume the state of said input-coupling region; a plurality of odd-numbered coupling pathways, including at least $1^{st}$, $3^{rd}$, and $5^{th}$ coupling pathways [e.g., FIG. 2A, portion of element 23 that links elements 25 and 21 plus portion of element 25 that lies beneath element 23 (for vertical chainlink) or FIG. 2B, portion of Region 3 plus portion of insulating magnetic material that links Regions 3 & 4 (for vertical chainlink) or FIG. 15, element 158 plus portion of element 159 that lies beneath element 158 (for lateral chainlink)], each positioned between a respective domain wall trapping region [e.g., FIG. 2A, FIG. 2A, portion of element 21 that does not overlap element 23 or element 27 (for vertical chainlink) or FIG. 15, portion of element 159 that does not overlap elements 157 or 158 (for lateral chainlink)] of an odd-numbered storage element and a respective input-coupling region [e.g., FIG. 2A, portion of element 28 that lies between element 26 and element 29 (for vertical chainlink) or FIG. 15, portion of element 154 that lies beneath 158 (for lateral chainlink)] of an even-numbered storage element and configured to couple said respective trapping region's state to said respective input-coupling region, such that the $1^{st}$ coupling pathway causes the state of the $2^{nd}$ storage element's input-coupling region to assume a state corresponding to the state of the $1^{st}$ storage element's trapping region, the $3^{rd}$ coupling pathway causes the state of the $4^{th}$ storage element's input-coupling region to assume a state corresponding to the state of the $3^{rd}$ storage element's trapping region, the $5^{th}$ coupling pathway causes the state of the $6^{th}$ storage element's input-coupling region to assume a state corresponding to the state of the $5^{th}$ storage element's trapping region; a plurality of even-numbered coupling pathways, including at least $2^{nd}$, and $4^{th}$ coupling pathways, each positioned between a respective trapping region of an even-numbered storage element and a respective input-coupling region of an odd-numbered storage element and configured to couple said respective trapping region's state to said respective input-coupling region, such that the $2^{nd}$ coupling pathway causes the state of the $3^{rd}$ storage element's input-coupling region to assume a state corresponding to the state of the $2^{nd}$ storage element's trapping region, the $4^{th}$ coupling pathway causes the state of the $5^{th}$ storage element's input-coupling region to assume a state corresponding to the state of the $4^{th}$ storage element's trapping region; an odd-numbered activation pathway [e.g., FIG. 2A, depicted in part as the elements 20 and 22 (for vertical chainlink) or FIG. 15, elements 151-152 (for lateral chainlink)], configured to simultaneously deliver a first activation excitation to the sensitization terminals of the odd-numbered storage elements; and an even-numbered activation pathway [e.g., FIG. 2A, depicted in part as the elements 24 and 26 (for vertical chainlink) or FIG. 15, elements 155-156 (for lateral chainlink)], configured to simultaneously deliver a second activation excitation to the sensitization terminals of the even-numbered storage elements. The input-coupling region and trapping region of each storage element may be integrally formed from a single material or class of materials (e.g., magnetic multilayer) [e.g., FIG. 2A, element 21 (for vertical chainlink) or FIG. 15, element 159 (for lateral chainlink)]. Each coupling pathway may comprise an output-coupling region and an insulator [e.g., FIG. 2A, portions of elements 25 and 23, respectively, that lie beneath element 21 (for vertical chainlink), or FIG. 15, portion of element 159 that overlaps 158, and element 158, respectively (for lateral chainlink)], wherein the output-coupling region abuts, and is integrally formed with, the trapping region whose state is to be coupled [e.g., FIG. 2B, Region 2 (for vertical chainlink) or FIG. 15, portion of element 159 that does not lie beneath elements 157 and 158 (for lateral chainlink)] and the insulator is disposed between said output-coupling region and the input-coupling region of the next-numbered storage element [e.g., FIG. 2A, portion of element 23 between elements 25 and 21 (for vertical chainlink) or FIG. 15, element 158 (for lateral chainlink)]. The first and second activation excitations are preferably non-overlapping. In some embodiments, the even-numbered coupling pathways are non-inverting, such that the 3rd storage element's input-coupling region assumes the state of the 2nd storage element's trapping region, the 5th storage element's input-coupling region assumes the state of the 4th storage element's trapping region, and the 7th storage element's input-coupling region assumes the state of the 6th storage element's trapping region. In other embodiments, the even-numbered coupling pathways are state-inverting, such that the 3rd storage element's input-coupling region assumes the inverse of the state of the 2nd storage element's trapping region, the 5th storage element's input-coupling region assumes the inverse of the state of the 4th storage element's trapping region, and the 7th storage element's input-coupling region assumes the inverse of the state of the 6th storage element's trapping region. In some embodiments, the odd-numbered coupling pathways are non-inverting, such that the 2nd storage element's input-coupling region assumes the state of the 1st storage element's trapping region, the 4th storage element's input-coupling region assumes the state of the 3rd storage element's trapping region, the 6th storage element's input-coupling region assumes the state of the 5th storage element's trapping region. And in other embodiments, the odd-numbered coupling pathways are state-inverting, such that the 2nd storage element's input-coupling region assumes the inverse of the state of the 1st storage element's trapping region, the 4th storage element's input-coupling region assumes the inverse of the state of the 3rd storage element's trapping region, and the 6th storage element's input-coupling region assumes the inverse of the state of the 5th storage element's trapping region. The input-coupling and trapping regions of each storage element are integrally formed, preferably from a single material or from a single class of materials, such as a magnetic multilayer. In some embodiments, each coupling pathway comprises an output-coupling region [e.g., FIG. 2B, Region 3 (for vertical chainlink) or FIG. 15, portion of element 159 that lies beneath element 158 (for lateral chainlink)] and an insulator [e.g., FIG. 2B, portion of insulating magnetic material that links Regions 3 & 4 (for vertical chainlink) or FIG. 15, element 158 (for lateral chainlink)], wherein the output-coupling region abuts, and is integrally formed with, the trapping region whose state is to be coupled, and the insulator is disposed between said output-coupling region and the input-coupling region of the next-numbered storage element. In most embodiments, the first state comprises a first principle direction of magnetization, and the second state comprises a second principle direction of magnetization that is detectably different from the first direction. The first and second directions are preferably substantially opposite, or substantially orthogonal. Said coupling may consist mostly of magnetic exchange coupling, or mostly of magnetostatic coupling. In one preferred embodiment, said odd-numbered storage elements [e.g., FIG. 16, elements 159, 160] are disposed linearly, in a first layer, with non-magnetic regions [e.g., FIG. 18, "OXIDE/FILL"] separating each linearly adjacent, odd-numbered storage element to form an odd-numbered storage element track; said even-numbered storage elements [e.g., FIG. 16, element 154] are disposed linearly, and parallel to said odd-numbered element track, also in said first layer, and also with non-magnetic regions separating each linearly adjacent, even-numbered storage element to form an even-numbered storage element track; a track separation region comprising an insulator [e.g., FIG. 16, "OXIDE/FILL"] is disposed laterally, in said first layer, between said odd-numbered and even-numbered storage element tracks; each coupling pathway comprises, at least in part, a magnetic region [e.g., FIGS. 15-18, element 157] that includes an insulator, disposed in a second layer above said first layer, and at least partially overlying each of said odd-numbered and even-numbered storage element tracks; said odd-numbered activation pathway comprises, at least in part, a series of metal segments [e.g., FIGS. 15 & 18, elements 151-152], disposed in a third layer below said first layer, said segments located beneath said odd-numbered storage element track; and, said even-numbered activation pathway also comprises, at least in part, a series of metal segments [e.g., FIG. 15, elements 155-156], also disposed in the third layer, said segments located beneath said even-numbered storage element track.

Again, generally speaking, and without intending to be limiting, still another aspect of the invention relates to storage devices that comprise, for example, at least: a first series of at least four state-transitionable elements [e.g., FIG. 3, lower row of STT bitcell links (for vertical chainlink)], said elements linked by a first active excitation pathway [e.g., FIG. 3, collection of lowermost conductive segments (for vertical chainlink)] and transitionable in response to a first activation excitation [e.g., FIG. 3, "Current Phase 1" (for vertical chainlink)] conveyed via said pathway; a second series of at least four state-transitionable elements [e.g., FIG. 3, upper row of STT bitcell links (for vertical chainlink)], said elements linked by a second active excitation pathway [e.g., FIG. 3, collection of uppermost conductive segments (for vertical chainlink)] and transitionable in response to a second activation excitation [e.g., FIG. 3, "Current Phase 2" (for vertical chainlink)] conveyed via said pathway; a first passive state-coupling pathway, said pathway including at least four passive couplings, each positioned between a state-transitionable element in the first series and a respective state-transitionable element in the second series [e.g., FIG. 3, couplings (only 3 depicted) linking right ends of upper STT bitcell links with left ends of lower STT bitcell links (for vertical chainlink)]. Such storage devices preferably further include a second passive state-coupling pathway, said pathway including at least four passive couplings, each positioned between a state-transitionable element in the second series and a respective state-transitionable element in the first series [e.g., FIG. 3, couplings (only 3 depicted) linking left ends of upper STT bitcell links with right ends of lower STT bitcell links (for vertical chainlink)]. Such pathways are preferably configured so that: in response to the first activation excitation, each of the state-transitionable elements in the first series assumes a state that is passively coupled by the respective coupling in the first state-coupling pathway, and in response to the second activation excitation, each of the state-transitionable elements in the second series assumes a state that is passively coupled by the respective coupling in the second state-coupling pathway. Each of said state-transitionable elements is preferably transitionable at room temperature between at least first and second states, wherein said first state is characterized by a first principle direction of magnetization in a predefined region of the element, and wherein said second state is characterized by a second principle direction of magnetization in said predefined region that is detectably different from said first principle direction. Alternatively, each of said state-transitionable elements may be transitionable at room temperature between at least first and second states, wherein said first state is characterized by the presence of a domain wall in the element, and wherein said second state is characterized by the absence of a domain wall in the element. The first activation excitation preferably causes any domain wall(s) in the first series of state-transitionable elements to disappear, and the second activation excitation causes any domain wall(s) in the second series of state-transitionable elements to disappear. Said first and second activation excitations are at least partially non-overlapping. Each of the state-transitionable elements preferably includes a trapping region, bounded by one or more energy barrier(s), and configured to contain the movability of domain walls within the trapping region. Each of said couplings preferably comprises an insulating magnetic material, and/or a two-layer structure that includes an insulating magnetic material and a perpendicular magnetic material.

DESCRIPTION OF THE DRAWINGS

Various aspects of the present invention are illustrated by the accompanying set of drawings, in which.

DISCUSSION OF EXEMPLARY EMBODIMENTS

Inventors' Lexicography

As used in this disclosure and the claims that follow, unless the context clearly demonstrates otherwise, the term "insulator" shall refer to a material or region whose principal function in the device or system is to prevent current flow across or through the material or region. In other words, the presence or possibility of some de minimis current flow across or through a material or region would not disqualify such material or region as an "insulator," so long as the implicated current flow was not of a magnitude that would materially impede the material's or region's insulating function within the system or device. Other versions of the word (e.g., "insulate," "insulates," etc.) shall be similarly defined, unless the context clearly dictates otherwise.

As used in this disclosure and the claims that follow, unless the context clearly demonstrates otherwise, the term "couple" shall refer to an interaction between two or more elements with magnetization. This coupling may include magnetostatic coupling through electromagnetic fields, or exchange coupling through contact between two magnetic materials. The coupling may result in parallel (e.g., ferromagnetic coupling), antiparallel (e.g., antiferromagnetic coupling), or another alignment of magnetization. Further, this coupling may be passive or may require activation by excitation. For example, one might desire to thermally assist the coupling by applying heat.

As used in this disclosure and the claims that follow, unless the context clearly demonstrates otherwise, the term "simultaneous" as it relates to an activation pathway shall encompass a situation in which the activation excitation may arrive at different bitcell elements at slightly different instants due to delay. Such delay could be caused, for example, by capacitive charging or discharging, or other circuit-related effects.

Physical Principles

The following sections attempt to explain the physical principles of operation that the inventors believe to support operation of the present invention. As anyone skilled in the art will appreciate, these physical principles are not directly observable, and the models that we develop based on these principles are often approximate. Thus, while we can offer no assurances that the theories, equations, and models herein are completely correct or accurate, we include them here because we believe that they will assist the skilled artisan in further understanding—and practically applying—the inventive teachings herein.

Spin-Transfer Torque

Figure 1:
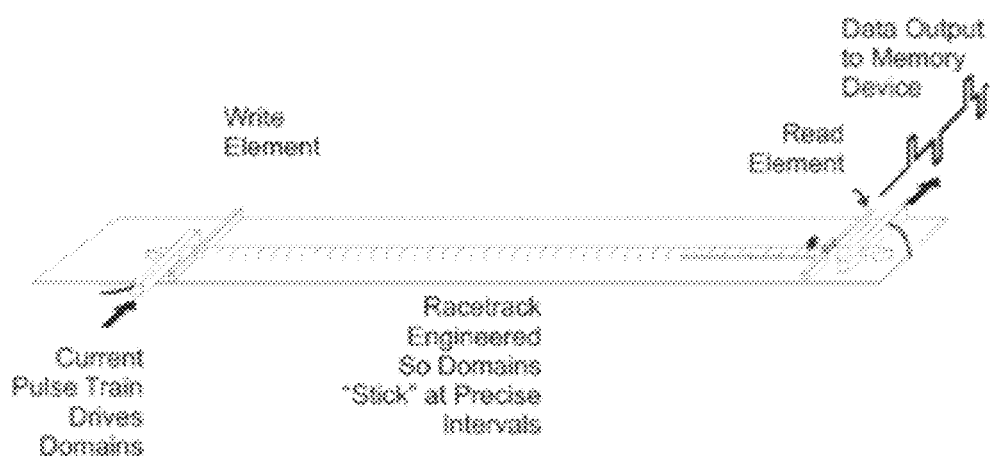
FIG. 1 conceptually depicts a prior-art racetrack memory device.
Figure 2A:
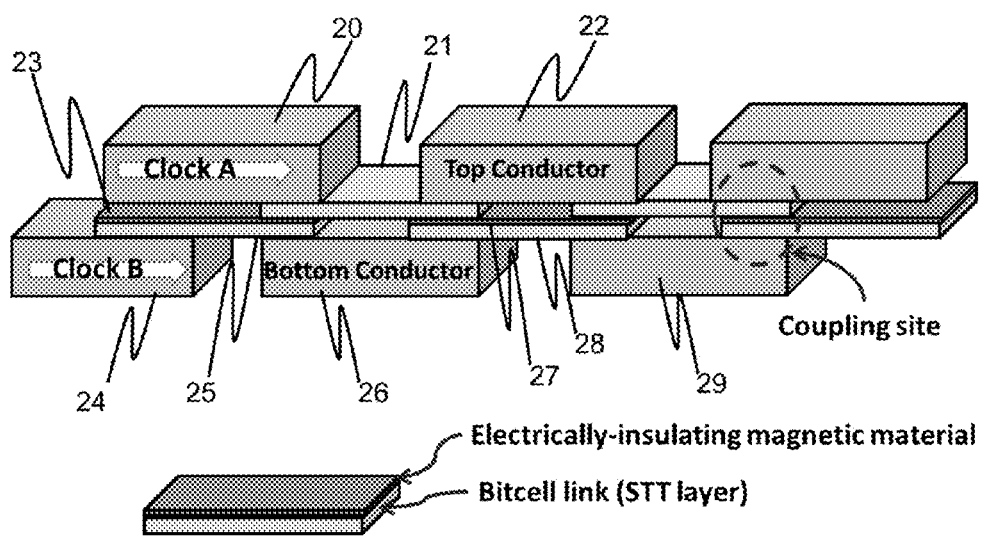
FIG. 2A conceptually depicts a portion of a vertical chainlink memory.
Figure 2B:
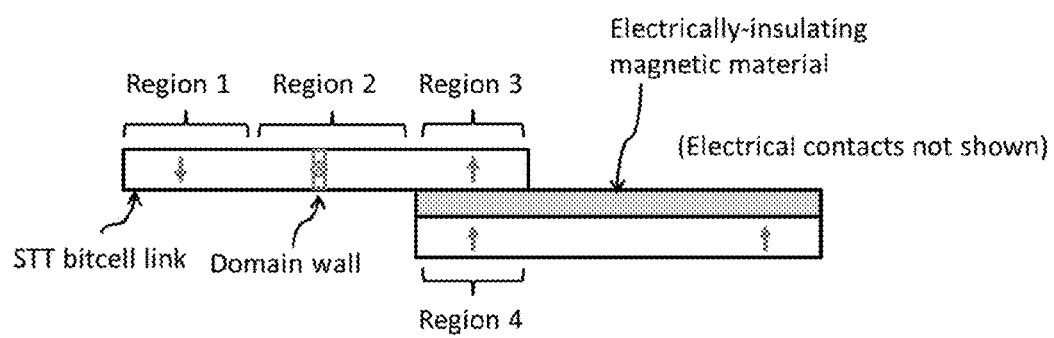
FIGS. 2B-D conceptually illustrate different states of the exemplary chainlink memory.
Figure 2C:
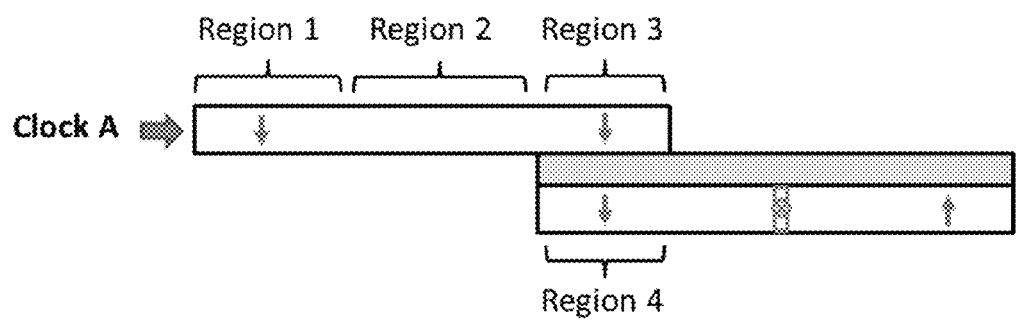
Figure 2D:
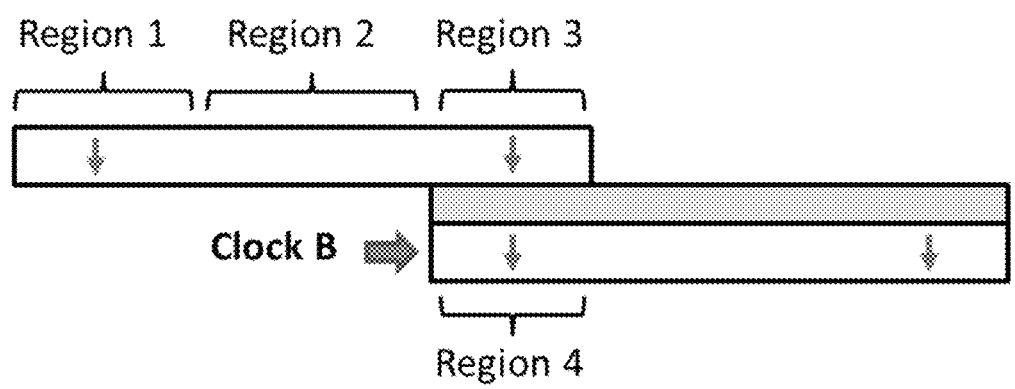
Figure 2E:
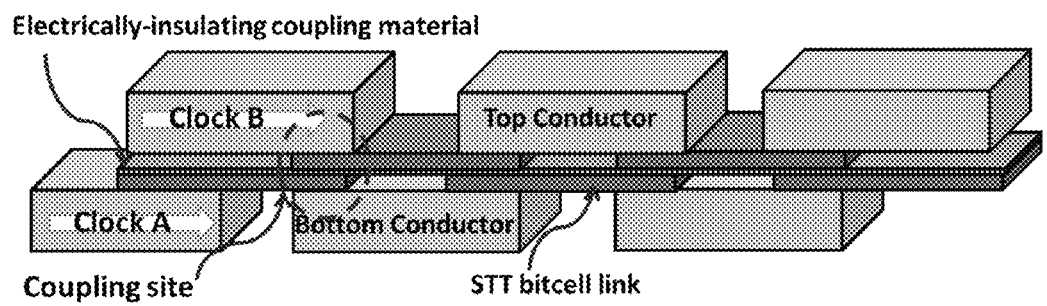
FIG. 2E conceptually depicts a portion of a vertical chainlink memory with a continuous insulating film.
Figure 3:
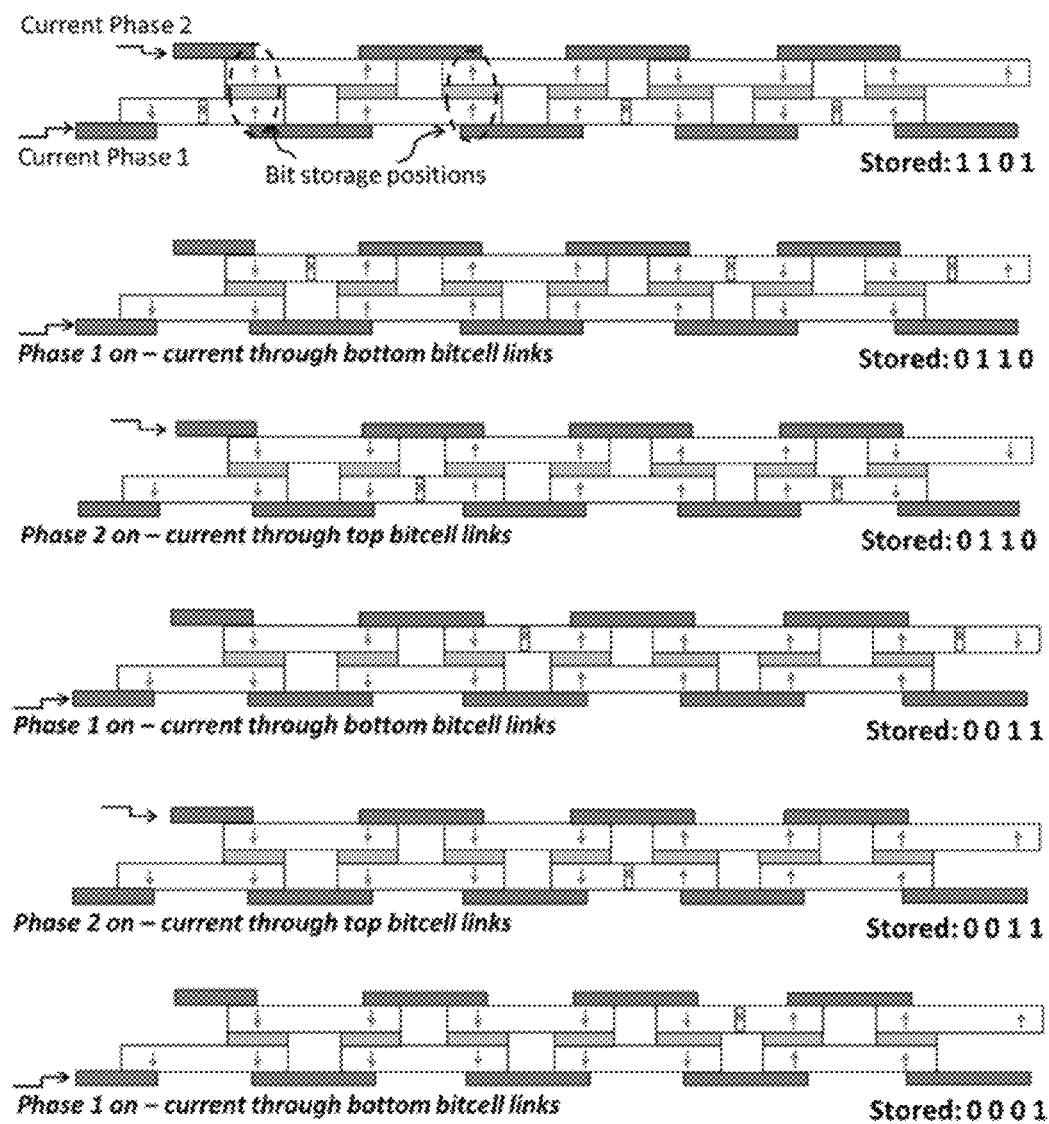
FIG. 3 conceptually depicts an exemplary chainlink structure showing electrical connection for two-phase current control. The non-overlapping phases shift the data in the chain sequentially, where every two links effectively "store" one bit.
Figure 4:
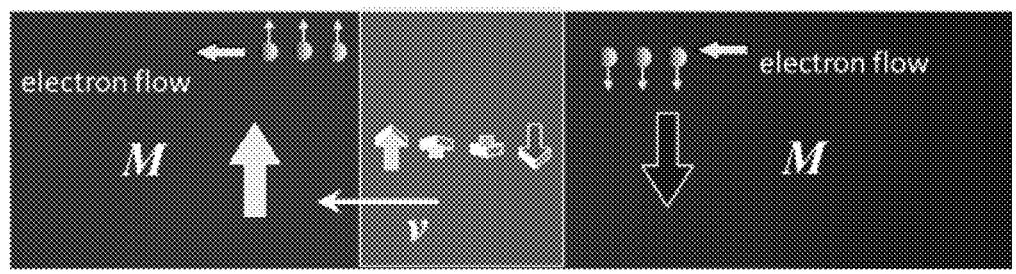
FIG. 4 is a conceptual illustration of domain wall motion driven by a spin-polarized electron current.

The programming of chainlink memory bitcells may be accomplished by spin-transfer torque, where a current of spin-polarized electrons can reorient the magnetization of a ferromagnetic material. As depicted conceptually in FIG. 4, an electron flowing in a magnetized material has its spin polarized in the direction of the magnetization (e.g., "spin-down" or "spin-up"). Once this spin-polarized electron reaches a region of magnetization oriented in a different direction (a domain wall, for instance), its spin is re-polarized to align with the local magnetization. The spin re-alignment yields a change in the spin angular momentum of the electron; to conserve angular momentum, a torque is exerted on the local magnetic moment of the material. This spin-transfer torque acts on the magnetization to align it with the electron's initial polarization. If a spin-down electron enters a region of magnetization oriented up, the spin-transfer torque will then act to pull that magnetization downward (FIG. 4). This phenomenon can be used to move magnetic domain walls in the direction of electron flow.

To model these phenomena, we consider a sample slice of thickness dy in the direction of current flow; the spin torque, or the time rate of change of the spin angular momentum $\vec{S}$, can be determined by equating the time evolution of the local magnetization and the amount of angular momentum deposited by the spin-polarized conduction electrons:

$$\frac{d\vec{S}}{dt} = -\frac{1}{\gamma}\frac{\partial \vec{\mu}}{\partial t} = -\frac{1}{\gamma}\frac{\partial \vec{M}}{\partial t}dxdydz \quad (1)$$

$$= P\left(\frac{J}{e}\right)\frac{\hbar}{2}dxdz\left[\frac{\vec{M}(y+dy) - \vec{M}(y)}{M_s}\right]$$

Here, $\vec{\mu}$ is the magnetic moment, $M_S$ the saturation magnetization of the material, $\gamma$ the gyromagnetic ratio (equal to $$\frac{g\mu_B}{\hbar},$$

where g is the Landé factor and $\mu_B$ the Bohr magneton), P the electron spin polarization, J the charge current density, e the electron charge, h the reduced Planck constant, and $\vec{M}$ the magnetization vector. The resulting time rate of change of the magnetization due to the spin current is obtained by solving the above equation for $$\frac{\partial \vec{M}}{\partial t}:$$

$$\frac{\partial \vec{M}}{\partial t} = -\frac{gJ\mu_B P}{2eM_s}\frac{\partial \vec{M}}{\partial y} \quad (2)$$

The coefficient $$\frac{gJ\mu_B P}{2eM_S}$$

is generally lumped into a single quantity u, often referred to as the spin current velocity or spin current density, with units of m/s. For a three-dimensional current flow and magnetization gradient, we can generalize the above result to:

$$\frac{\partial \vec{M}}{\partial t} = -(\vec{u}\cdot\vec{\nabla})\vec{M} \quad (3)$$

Importantly, the spin-transfer torque behind domain wall motion is proportional to the current density and to the spatial gradient of the magnetization.

Other Switching Effects

In this disclosure, spin-transfer torque is assumed to be the mechanism causing domain wall motion upon current injection. However, it should be noted that a variety of other effects could be exploited to achieve the same result. For example, the Rashba effect in structurally-asymmetric systems, or the spin Hall effect in materials with a large spin Hall angle could both be used to program the magnetization of chainlink structures. The use of STT is only presented to illustrate the basic concepts of the invention. Any effect leading to current-induced domain wall motion may also be incorporated or exploited.

Dynamics

Spin torque, of course, is not the only quantity that can effect a change in the magnetization of a material. Other torques due to an applied field, effective magnetic fields internal to the material, as well as damping are also present. The phenomenological equation that describes the behavior of a magnetic moment subjected to these torques is the Landau-Lifshitz-Gilbert equation. Modified for STT with a current flow in the y-direction, the equation is given by $$\frac{\partial \vec{M}}{\partial t} = -\gamma(\vec{M}\times\vec{H}_{EFF}) + \frac{\alpha}{M_S}\left(\vec{M}\times\frac{\partial \vec{M}}{\partial t}\right) - u\frac{\partial \vec{M}}{\partial y} \quad (4)$$

Where $\vec{H}_{EFF}$ the effective magnetic field and $\alpha$ the Gilbert damping constant.

The effective field is the vector sum of the applied field (zero for chainlink memory, which is current-driven), the anisotropy field $\vec{H}_K$ (describing the tendency of the magnetization to lie along a preferred direction, which is perpendicular to the film plane in the presented chainlink designs), the exchange field $\vec{H}_{EX}$ (describing the tendency of neighboring magnetic moments to align parallel to one another), and the demagnetizing field $\vec{H}_D$ (the magnetostatic interaction between all magnetic moments in the material due to surface and volume pole densities). In the continuum form of micromagnetics, these fields are given by:

$$\vec{H}_K = \frac{2K_u}{M_S}\hat{a}(\vec{M}\cdot\hat{a}) \quad (5)$$

$$\vec{H}_{EX} = \frac{2A}{M_S}\vec{\nabla}^2\vec{M} \quad (6)$$

$$\vec{H}_D = \int\frac{\rho(\vec{r}')(\vec{r}-\vec{r}')}{|\vec{r}-\vec{r}'|^3}dV' + \int\frac{\sigma(\vec{r}')(\vec{r}-\vec{r}')}{|\vec{r}-\vec{r}'|^3}dA' \quad (7)$$

In Equation (5), $K_u$ is the uniaxial anisotropy strength and $\hat{a}$ the direction in which the anisotropy acts (i.e., the preferred direction of the magnetization, which is perpendicular to the film plane for the chainlink bitcells described in this disclosure). In Equation (6), A is the exchange stiffness of the material, a measure of the strength of the quantum mechanical coupling effect that aligns neighboring dipole moments. In Equation (7), $\rho(\vec{r}')$ is the volume pole density and $\sigma(\vec{r}')$ is the surface pole density of fictitious magnetization charge used to compute magnetostatic fields arising from magnetization. The field due to magnetization charge at the point r' is evaluated at the point r. Coupling Mechanisms The coupling between bitcells—the propagation mechanism that eliminates annihilation in chainlink memory—may be of magnetostatic origin, exchange origin, or a mix of both. In the magnetostatic coupling case, the dipole interaction between the magnetic moments in the output area of one link and the magnetic moments in the input area of the other link induces the magnetization in these areas to align parallel or antiparallel to one another, given the placement of the two sites relative to one another. For materials with perpendicular anisotropy, if the input sites are vertically collinear, parallel alignment is preferred; for a horizontal collinear arrangement, antiparallel alignment is preferred. For this coupling mechanism, the insulating material separating the two links need not be magnetic; however, its thickness should be small enough (e.g., 1-2 nm) to ensure the coupling field is great enough to induce switching.

In the case of exchange coupling, the quantum mechanical exchange interaction between local magnetic moments governs the coupling between links. This implies that the insulator between the two links should be magnetic, such that the magnetization of the lower link may propagate up to the upper link (or vice versa). Additionally, an electrically-insulating, magnetic coupling layer with a stronger exchange stiffness may yield more efficient propagation. Materials with exchange stiffness constants ranging from 1e-7 to 1e-6 erg/cm should suffice.

In general, higher values of the anisotropy strength of materials magnetized perpendicular to the film plane enhances STT efficiency due to the greater magnetization gradient. Anisotropy strengths above 1e6 erg/cm$^3$ are presently believed to be most appropriate.

Estimated Current and Voltage Requirements

For a one-dimensional domain wall in a perpendicular material with the anisotropy strength described, and in the absence of an applied field, the current needed to drive wall motion by STT can be approximated (in CGS units) as:

$$I \approx \left(\frac{\alpha}{2P}\right)\left(\frac{e}{\hbar}\right)\Delta E + \left(\frac{1+\alpha^2}{gP}\right)\left(\frac{2e}{\mu_B}\right) M_S A v_W \quad (8)$$

where $\alpha$ is the Gilbert damping constant, P the material spin polarization, g the Landé factor, $\mu_B$ the Bohr magneton, $\Delta E$ the energy barrier for domain wall pinning, $M_S$ the material saturation magnetization, A the cross-sectional area of the wall, and $v_W$ the domain wall velocity. If we assume an energy barrier of 60 $k_B T$ is sufficient to pin the domain wall (i.e., keep it in the trapping region, or channel, under equilibrium), then at room temperature for a material with $\alpha$=0.01 and P=0.4, the required current is given by the first term and is approximately 5 µA. Note that this is the current required to push the wall into the higher-energy output sites of the bitcells (e.g., the thicker and/or taller regions). The channel itself, as it is preferably composed of uniform material with uniform sizing, does not present an energy barrier. If the current is 5 µA with a zero energy barrier during this motion in the channel, then solving Equation (8) for velocity (at the proposed device nanoscale dimensions) yields a result on the order of 10 nm/ns. It is important to note that this is only an approximation.

In the examples presented so far, the chainlink memory is effectively composed of two (magnetically-coupled) series chains of bitcells. Therefore, the minimum voltage appropriate to drive 5 µA of current is a function of the total resistance of the series chain. If we assume a link resistance of 100Ω, then to drive 32 links in one series chain (64 total bitcells), a minimum voltage of 16 mV is preferred. A small number of bitcells per chain implies a large number of chains would compose the entire memory system.

Micromagnetic Simulation

To characterize the switching behavior of a chainlink bitcell, a micromagnetic simulation framework based on the finite difference method was utilized. In this method of simulation, an input geometry is discretized into a mesh of cubes (or cuboids), with a magnetic moment of constant magnitude defined in each cell. On every time step, the effective magnetic field acting on a cell (due to anisotropy, exchange, and demagnetization—no applied field is used in chainlink memory) is calculated. Additionally, the spin-transfer torque is evaluated in those cells that have current flowing through them. The underlying phenomenological equation—Landau-Lifshitz-Gilbert (Equation (4))—is then solved in each cell, on each time step. Because space is discretized, the original nonlinear partial differential equation in Equation (4) becomes a nonlinear ordinary differential equation in each cell. The discrete forms of Equations (5) through (7) become:

$$\vec{H}_K(i,j,k) = \frac{2K}{M_S}[\sin\theta_{i,j,k}\cos\varphi a_{i,j,k} M_{X_{i,j,k}} + \quad (9)$$
$$\sin\theta_{i,j,k}\sin\varphi_{i,j,k} M_{Y_{i,j,k}} + \cos\theta_{i,j,k} M_{Z_{i,j,k}}][\sin\theta_{i,j,k}\cos\varphi_{i,j,k}\hat{x} +$$
$$\sin\theta_{i,j,k}\sin\varphi_{i,j,k}\hat{y} + \cos\theta_{i,j,k}\hat{z}]$$

$$\vec{H}_{EX}(i,j,k) = \quad (10)$$
$$\frac{2A}{M_S}\left[\frac{1}{\Delta x^2}\sum_{i'}^{nnx} M_{X_{i+i'}}\hat{x} + M_{Y_{i+i'}}\hat{y} + M_{Z_{i+i'}}\hat{z} + \frac{1}{\Delta y^2}\sum_{j'}^{nny} M_{X_{j+j'}}\hat{x} + \right.$$
$$\left. M_{Y_{j+j'}}\hat{y} + M_{Z_{j+j'}}\hat{z} + \frac{1}{\Delta z^2}\sum_{k'}^{nnz} M_{X_{k+k'}}\hat{x} + M_{Y_{k+k'}}\hat{y} + M_{Z_{k+k'}}\hat{z}\right]$$

$$\vec{H}_D(i,j,k) = \quad (11)$$
$$\sum_{i'=1}^{N_X}\sum_{j'=1}^{N_Y}\sum_{k'=1}^{N_Z}\begin{bmatrix} N_{XX} & N_{XY} & N_{XZ} \\ N_{YZ} & N_{YY} & N_{YZ} \\ N_{ZX} & N_{ZY} & N_{ZZ} \end{bmatrix}_{(i'-i),(j'-j),(k'-k)}\begin{bmatrix} M_X \\ M_Y \\ M_Z \end{bmatrix}_{i',j',k'}$$

In the above equations, $N_X$, $N_Y$, and $N_Z$ are the number of mesh cells in the x, y, and z directions, $nn_X$, $nn_Y$, and $nn_Z$ are the nearest neighbors of a cell in the x, y, and z directions, K is the uniaxial perpendicular anisotropy strength, A the exchange stiffness constant, and $M_S$ the saturation magnetization. $\vec{M}$ is the magnetization vector, with components [$M_X$, $M_Y$, $M_Z$]. The orientation of the easy axes of cell (i,j,k) are given by the angles ($\theta_{i,j,k}$, $\theta_{i,j,k}$) in spherical coordinates. For a perfect perpendicular material, $\theta$ and $\phi$ would be 0 in every cell. In the demagnetizing field calculation, the magnetization components are convolved with a matrix of demagnetizing factors, N, a tensor which represents the coupling between cells as a function of geometrical position. Importantly, any given cell in the mesh is coupled to every other cell, which makes the calculation of this field tedious. The tensor component expressions may be found in the literature.

Figure 5:
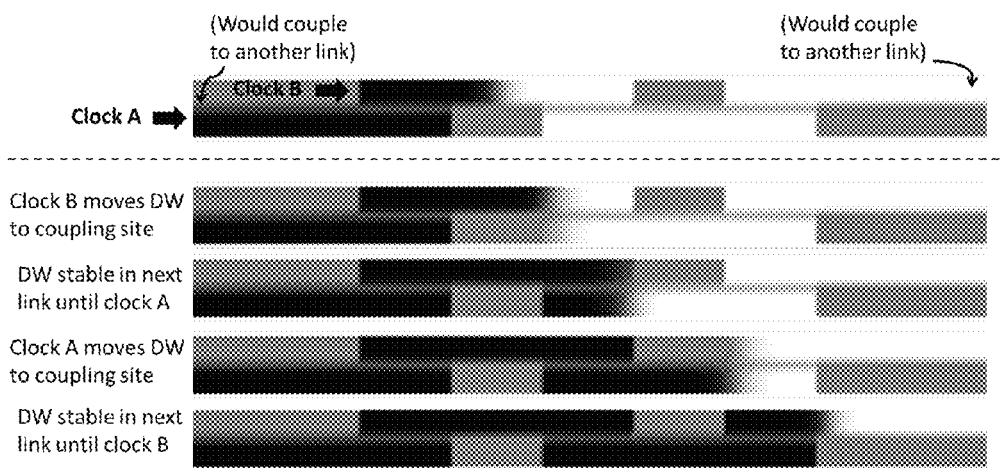
FIG. 5 is a micromagnetic simulation demonstrating chainlink memory operation.

To verify the functionality of the chainlink concept, micromagnetic simulation on a mesh of four links (two complete bitcells) was performed (FIG. 5). An electrically-insulating magnetic material is placed between the two layers of links and is highlighted for clarity. Perfect insulation is assumed, although as noted, it is not necessary. Each link is 60 nm long and 20 nm wide; the overlap of two links is 20 nm long. Current phase A flows through the bottom links and current phase B through the top links (2 ns pulses were used in the simulation). Initially, the stored bits are (with 0 represented by downward magnetization and 1 by upward magnetization), with a domain wall in the first top link. When current phase B is activated, the domain wall begins to move due to the spin-transfer torque exerted by the conduction electrons, flowing from left to right in the figure. It enters the output-coupling site and enters the next link. Current phase B then shuts off. The stored pattern is still 01. When current phase A is activated, the wall moves through the bottom link in the direction of the electron flow, pushes through the output site, and reaches the second top link. Now, the stored pattern is 00, indicating the data has fully shifted. Importantly, when no current is applied through a link, a domain wall cannot escape. It may drift back and forth due to thermal noise, but cannot overcome the energy barrier to enter another link. The energy barrier is designed to be greater than $50\,k_B T$ to ensure room temperature stability and nonvolatility, and is given by the change in domain wall energy as the wall becomes taller in the coupling regions (Equation 12, where W is the link width, A the exchange stiffness in erg/cm, K the uniaxial anisotropy strength in erg/cm$^3$, and $\Delta h$ the change in wall height during coupling; we assume a Bloch wall).

$$E_B = 4W(\Delta h)\sqrt{AK} \quad (12)$$

Bitcell and Periphery Design: Patterned Structures

Figure 6A:
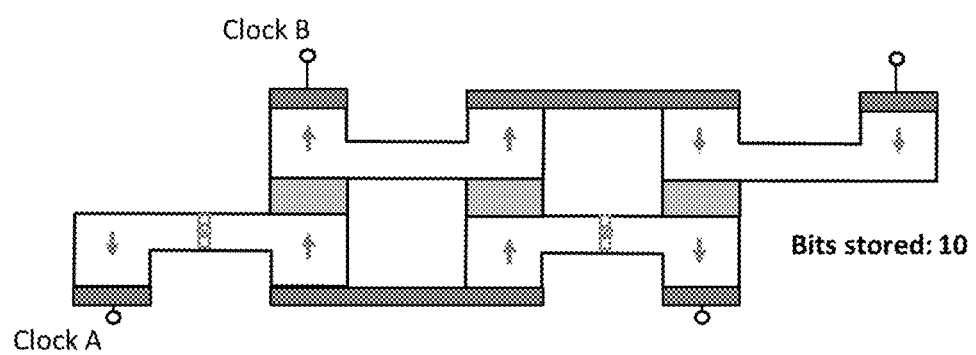
FIG. 6A depicts an exemplary vertical chainlink memory section with vertical patterning defining the trapping regions.
Figure 6B:
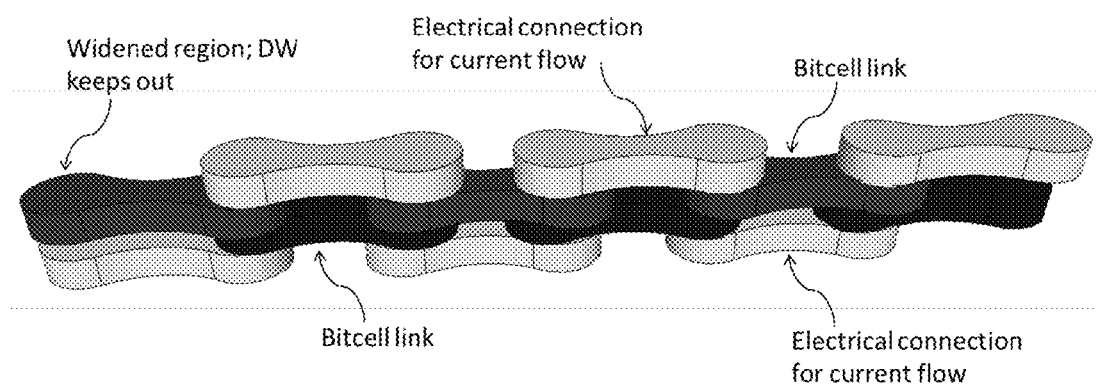
FIG. 6B depicts an exemplary vertical chainlink memory section with lateral patterning defining the trapping regions.

In the structures described so far, the energy barrier for the domain wall to enter the next link in the chain is due to the difference in its height in the trapping region and the output-coupling site. If desired for extra thermal stability, the energy barrier can be further tuned by patterning the links to enlarge the cross-sectional area (for a Bloch wall, which we assume). FIG. 6A conceptually depicts an embodiment in which the trapping regions are defined by a change in the height/thickness of the cell. FIG. 6B depicts an embodiment that varies the width(s), rather than thickness(es), to define the trapping regions. Of course, persons skilled in the art will recognize that additional alternatives (e.g., both wider and thicker, or irregularly shaped but larger in cross-section) are possible. Furthermore, although not specifically depicted, variations in material composition (e.g., doping by implantation or diffusion) or material properties (e.g., by use of selective energy treatment) may be used to provide the energy barrier(s) that define the trapping region(s).

Figure 7:
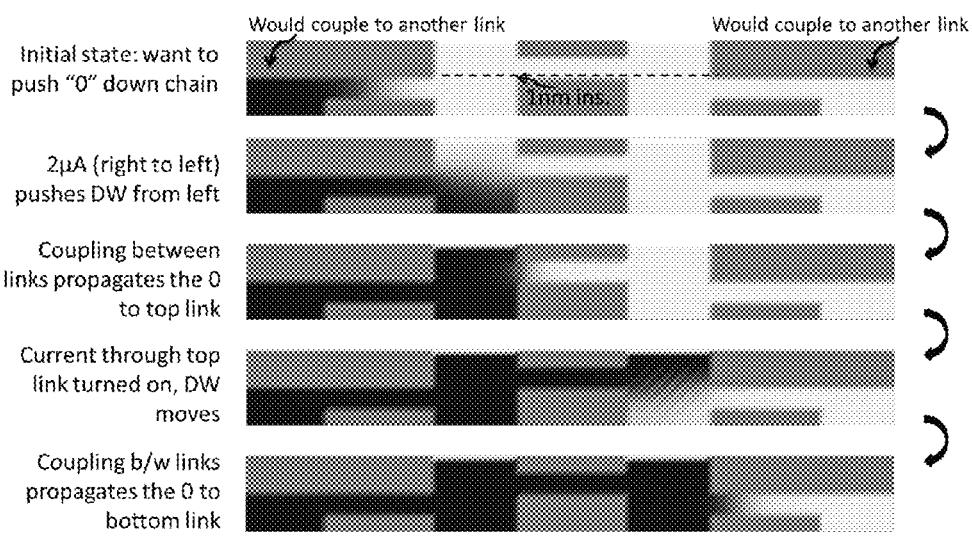
FIG. 7 shows micromagnetic simulations demonstrating the stability and switching functionality of a chainlink bitcell link design with vertically-patterned domain wall trapping regions.

Micromagnetic simulation of a chainlink design with vertically-patterned pinning sites was carried out to investigate its functionality. FIG. 7 demonstrates the structure operates as expected. A chain of three links (where the first and third link would, in general, couple to other links) served as the input case. Initially, the starting bit position (leftmost thick region of first link) stores a "0," with magnetization oriented downward; all other magnetic moments are oriented in the opposite direction. A 1 nm electrically-insulating magnetic material is inserted between the two bitcell links; for clarity, it is highlighted as a dashed line in the first frame of FIG. 5.

At t=0, an input electron current pulse is turned on, which pushes the domain wall along the channel of the first link in the direction of the electron flow. After sufficient time has passed, the domain wall enters the output-coupling region of the first link, and couples up to the top link. Perfect insulation between the bottom and top links is assumed (but is not, in reality, necessary), so no current flows between them at any point. The current does, however, flow through the third link as it flows through the first link, since they are electrically connected in the chainlink structure. However, given the initial state of the device (uniformly magnetized up), the current through the third link does not actually move a domain wall or propagate a new bit on this first pulse.

Once the propagation through the bottom link and coupling to the top link is complete, the current pulse is shut off. A second current pulse on a different, non-overlapping phase enters the top link. The process is repeated, with the domain wall in the top link pushing into the output coupling region and propagating the bit downward via exchange coupling. The bit that started in the storage position of link 1 has now successfully been pushed along the chain to link 3.

At this point in the simulation, all currents were turned off to observe the domain wall's motion in equilibrium. The wall rocks back and forth across the trapping region of the third link, but it does not overcome the energy barrier and pass into the output-coupling site of the third link. Were this to happen, then that bit would couple to a fourth link and program it unintentionally. The design of each bitcell link prevents this. Current pulses 2 ns in width were used.

Circular Buffer Loop Array Structure

Figure 8:
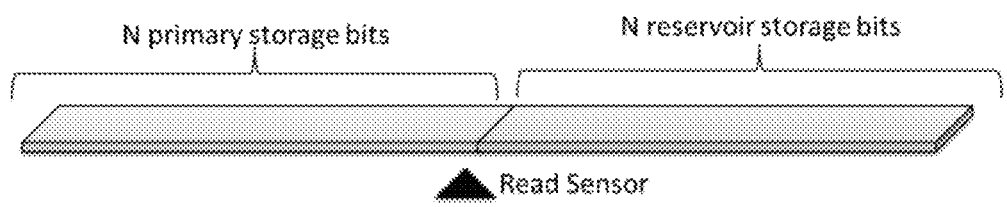
FIG. 8 depicts a reservoir region in racetrack memory allows non-destructive shifting but reduces storage density by a factor of 2.

As discussed in previous sections, chainlink bitcell links propagate data in a serial fashion, such that a bit couples to an adjacent link and no further. Over time, the data bits are continually shifted along the chain. Suppose the chain is a linear track of bitcells, with a read sensor positioned somewhere along the track. When a bit passes over the sensor, its state is read. The bit continues to propagate along the track, but once it enters the final bitcell, it is annihilated. Though the read operation itself is not destructive, the arrangement of the memory effectively makes it so that the data is lost after being read. This is a problem encountered in racetrack memory, where two solutions have been proposed. In one scheme, the data is read at the end of the track, and then re-written to the beginning of the track. This may incur area, energy, and speed penalties. A second approach described is to incorporate a so-called "reservoir" that doubles the length of the track (FIG. 8). As a result, every bit stored in the track is able to be pushed into the reservoir without any annihilation (excluding that caused by the timing and domain wall control already described). The input current driving the domain wall motion is then applied in the reverse direction, causing the bits stored in the reservoir to re-enter the primary data storage region. Although such embodiments of the present invention are easily realizable, this approach has an obvious area penalty, as the storage density drops by a factor of two to incorporate the surplus track length constituting the reservoir.

Figure 9:
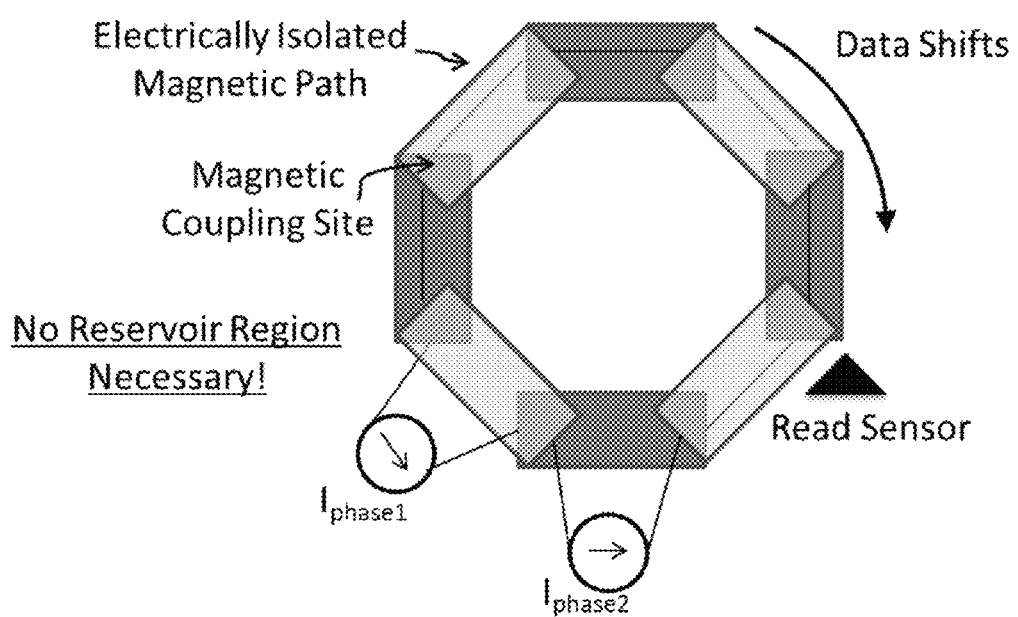
FIG. 9 is a conceptual illustration of a loop of chainlink bitcell links, with no reservoir region or write-back circuits.

Chainlink memory presents a new opportunity to address the destructive shifting issue. Unlike racetrack memory, adjacent links are (substantially) electrically isolated. This implies that a series of chainlink bitcell links can rotate in on itself to form a loop (FIG. 9). In this way, once the bits pass the read sensor, they are fed back into the beginning of the loop, with no reservoir or write-back circuits required. Such an approach is not possible with racetrack memory.

Peripheral Devices

In chainlink memory, data does not have to be converted back and forth between magnetic and electrical representations in each link. The data is stored magnetically and preferably read out by a separate structure somewhere along the chain. Likewise, data is preferably written by a separate structure somewhere along the chain. Bitcell links in separate storage chains can be interfaced by shared read and write devices for area savings and simplified addressing. CMOS support circuits for reading and writing can have limited connections to many magnetic bitcells, allowing for efficient heterogeneous integration techniques.

Write Interface

Figure 10:
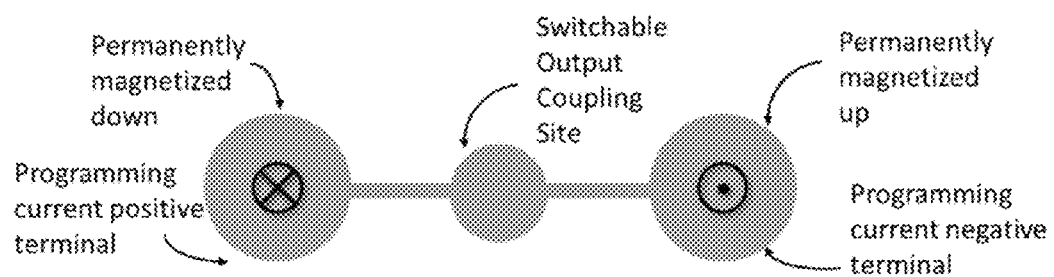
FIG. 10 is a top-down view of conceptual chainlink memory write device.

The write interface to the chainlink memory is preferably implemented as a magnetic device quite similar to a link itself. The basic structure is shown top-down in FIG. 10. It should be noted that this and subsequent figures of special chainlink elements are conceptual schematic representations. The circular region represents a region intended for coupling to separate link elements and the narrow line region represents a region with the capability to trap a domain wall. Both the coupling and trapping regions may take other shapes, or be formed in conjunction with shapes in contact or proximity (as discussed previously).

The exemplary write device has two terminals for the input of an electric current and one output magnetic coupling site. The input terminals are permanently magnetized antiparallel to one another; in FIG. 10, we assume perpendicular magnetization, with the left terminal magnetized down and the right magnetized up; the output site is not physically connected to a separate device, but transfers its state via magnetic coupling, much like the bitcells in the chainlink memory. The input terminals are electrically connected by a channel of magnetic material, with the output coupling site lying along that channel.

The operation of the write device is similar to that of a link, as it is based on spin-transfer torque. Given the direction of the programming current into the write device, electrons enter either the left magnetized terminal or the right one. These input electrons become spin-polarized in the direction of the terminal magnetization and push a domain wall to program the magnetization of the channel and the output coupling site along with it. This implies that given the direction of the input current, the output magnetic coupling site can be programmed to have magnetization either up or down. This coupling site transfers its magnetization to a bitcell link in the chainlink memory by the same coupling mechanisms previously discussed, thereby writing a "0" or "1," given the direction of the magnetization of the output coupling site after programming.

The permanent magnetization of the input terminals may be set antiparallel with an external field applied after fabrication. One terminal must magnetize in a smaller field than the other to allow for antiparallel programming. This can be achieved by sizing the terminals differently to obtain different coercivity, or by depositing material with different anisotropy strength. The latter comes at the costs of extra deposition and patterning steps to incorporate different materials on the same plane; the former, therefore, may be a more feasible approach. However, the difference in size required to clearly separate the coercivities of the terminals is important. If the size of one terminal must be very large (hundreds of nanometers square to square microns), a significant area penalty is imposed. For this reason, it is desirable to use a single write device for an entire chainlink shift register, or for large chains. In this way, the area cost of the large pads is amortized over the entire shift register.

Read Interface

To interface the chainlink memory with other circuitry that relies on electrical signals (e.g., CMOS, other spintronic systems), conversion of magnetic state to electric current or voltage is preferred. Two well-studied devices for this purpose include a giant magnetoresistive (GMR) stack and the magnetic tunnel junction (MTJ). In both of these devices, the resistance through the structure is low when the magnetization on either side of a spacer is parallel and high when the magnetization on either side of the spacer is antiparallel. In the GMR stack the spacer is a nonmagnetic metal, while in the MTJ it is a thin oxide through which electrons tunnel. Compared to the MTJ, GMR structures present a much lower resistance, but at the cost of a significantly lower switching ratio between the high and low resistance states.

Regardless of the structure used, it preferably should be deposited with the chainlink memory during manufacturing. The output-coupling site of a bitcell in the chain transfers its magnetic state to the read device, where that magnetic state is compared to a permanently magnetized layer on the other end of the spacer in the device. As a result, the resistance through the read device will change given the orientation of the magnetization of the bitcell's output coupling site. In general, MRAM schemes (with the notable exception of racetrack memory) incorporate the MTJ into each bitcell. In chainlink memory, not every bitcell requires its own read sensor, and so fewer MTJs per stored bit are necessary. This implies fewer interface circuits are required as well. Additionally, fewer circuits and fewer MTJs make the read operation less prone to variation, as there are fewer access transistors and read sensors distributed across the memory. This is important, as tunnel magnetoresistance ratio (MTJ switching ratio) variation across a wafer (and therefore across a system deposited on that wafer) can be large in magnitude.

Branch Link

Figure 11:
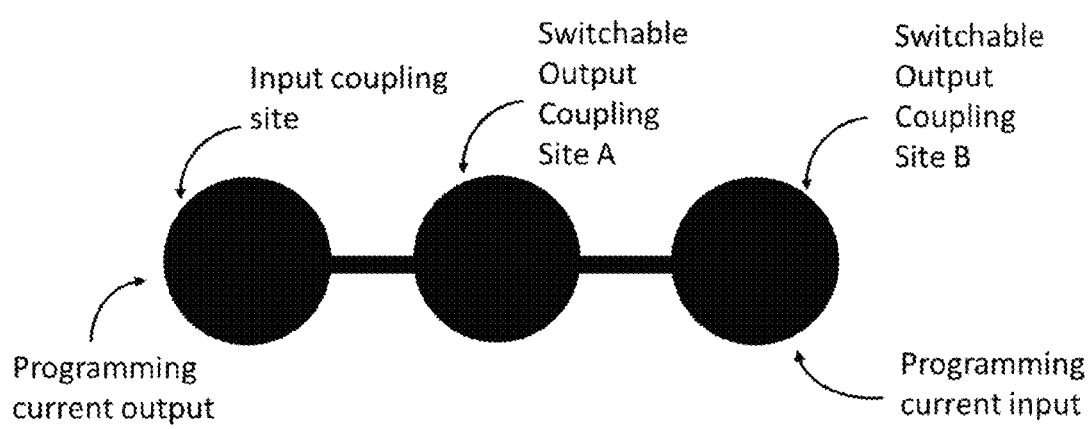
FIG. 11 is a top-down view of a branch link.

Another device that proves useful in chainlink memory architectures is the branch link, illustrated top-down in FIG. 11. There is one input magnetic coupling site and two output-coupling sites; the leftmost and rightmost sites are also electrical contacts. Domain wall trapping regions are placed between the coupling sites. The neck connecting the two output-coupling sites is not necessary, and so these two sites may be merged together. When a positive conventional current is input to the branch link, electrons flow from left to right and, by STT, propagate the input magnetization state to both outputs. Note that annihilation is not a problem here, as the magnetization in the input-coupling site is supposed to overwrite one or more domains in the output coupling site or preferential pinning locations.

A Y-shaped branch link may also be used but is not necessarily desirable, as current would have to divide between the two paths. Variations in resistance in the parallel paths may lead to unwanted current shunting, which could cause the state of one output to not be programmed correctly. A series link like that shown in FIG. 11 avoids current division, and is therefore more robust. The increased length of the device, combined with a potentially larger cross section, may lead to slower switching times when compared with a bitcell link. If necessary, these links may be clocked with higher input currents to reduce delay (at the cost of increased power).

Magnetic 2:1 Multiplexer

Figure 12:
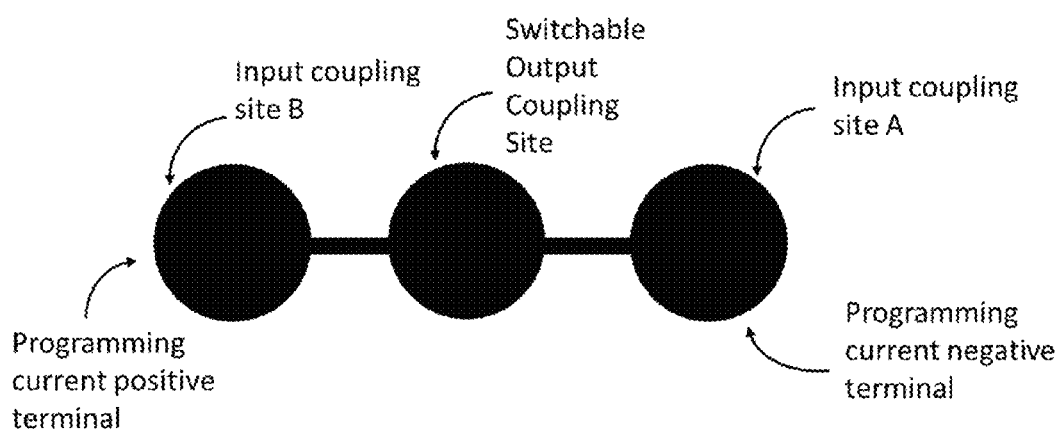
FIG. 12 is a top-down view of a 2:1 magnetic multiplexer.

Similar in structure, but different in purpose is the mux link. A 2:1 multiplexer (mux) is a circuit where, given the state of a select signal, one of the input signals is propagated to the output. In the context of chainlink memory, the inputs and output are all magnetic coupling sites and the select signal is a current direction. The input-coupling sites, which also serve as electric terminals, are electrically connected by a channel of magnetic material, with the output coupling site lying along that channel. The channel acts as a domain wall trapping region. This is shown in a top-down view in FIG. 12. The magnetization at the input sites are set by whatever devices the mux is coupled to; given the direction of the input current, only one of these magnetization states is propagated to the output coupling site via spin-transfer torque. For a positive conventional programming current, electrons flow from right to left in the figure, causing the magnetization at input site A to propagate to the output. Likewise, for a negative conventional programming current, electrons flow from left to right in the figure and cause the magnetization at input B to propagate to the output. Note that if the input and output coupling sites are sized identically, the energy to move a domain wall into either site is the same. In other words, it is entirely possible that when one input is selected, its magnetization state may propagate to both the output site as well as the other input site. This, however, is of little consequence given the manner in which the mux is used in a chainlink array.

The mux is similar in structure to the write device. In fact, the only difference is that the input terminals are not permanently magnetized, but are programmable via coupling. Higher fan-in multiplexers may be constructed by combining multiple 2:1 multiplexers and performing the computation over several cycles.

Combo Mux/Branch link

Figure 13:
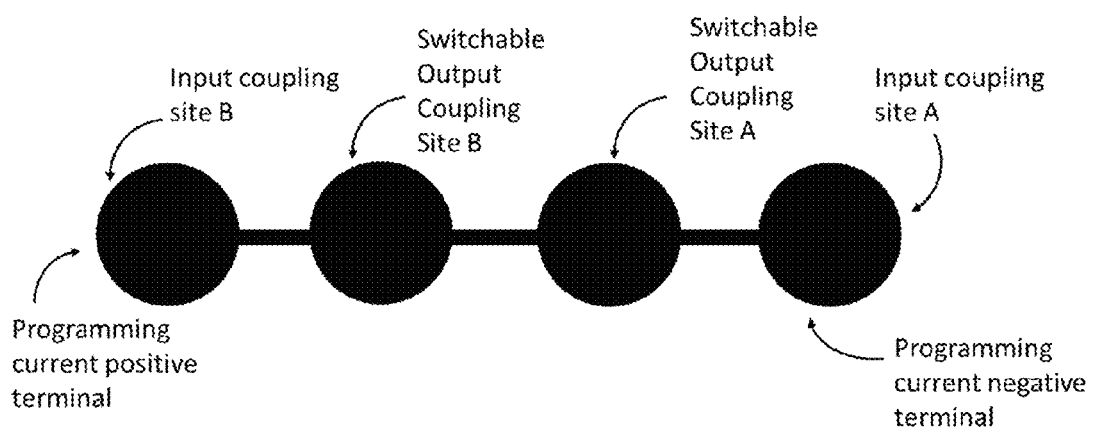
FIG. 13 is a top-down view of a combo mux/branch link.

The mux and branch link may be combined into one structure shown top-down in FIG. 13. This device works exactly the same as the aforementioned multiplexer, but the selected input magnetization is propagated to two outputs instead of one (still by the same mechanism, STT). Note that this requires an extra coupling site and domain wall trapping neck as compared to the traditional mux structure. Like in the branch link, the increased length of the device and the requirement to program two output coupling sites may lead to slower switching times when compared with the bitcell links. Again, these links may be clocked with higher input currents to reduce delay if necessary (at the cost of increased power). This element is useful as it enables the data from one of two input ports to be copied to two output ports.

Micromagnetic Simulation of Multiplexer and Branch Links

To verify the multiplexer and branch links behave as they should, a sample micromagnetic simulation was performed. In this simulation, two bitcell links are programmed on a first phase of current clock; each bitcell link is coupled to its own branch link, clocked on a second phase. One output of each branch link couples to an input of the 2:1 multiplexer, which is clocked on a third phase of current. Note that the clock applied to the mux could be of the same phase as that applied to the bitcells. The clocking scheme applied here just makes the state switching clearer to observe.

Figure 14:
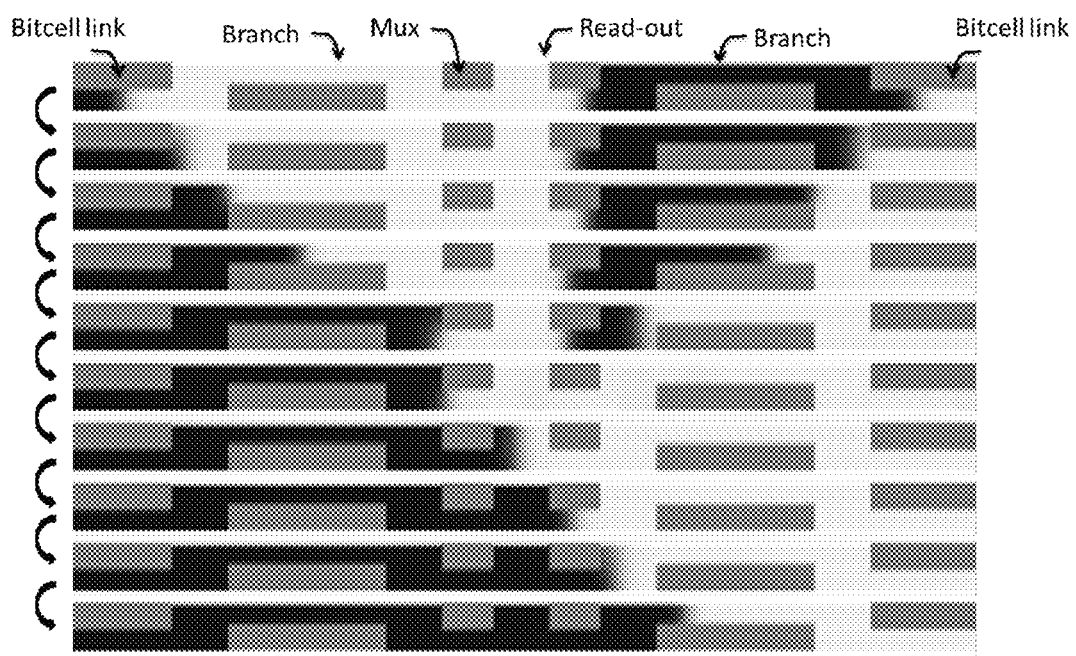
FIG. 14 is a micromagnetic simulation of bitcell links, branch links, and multiplexer.
Figure 15:
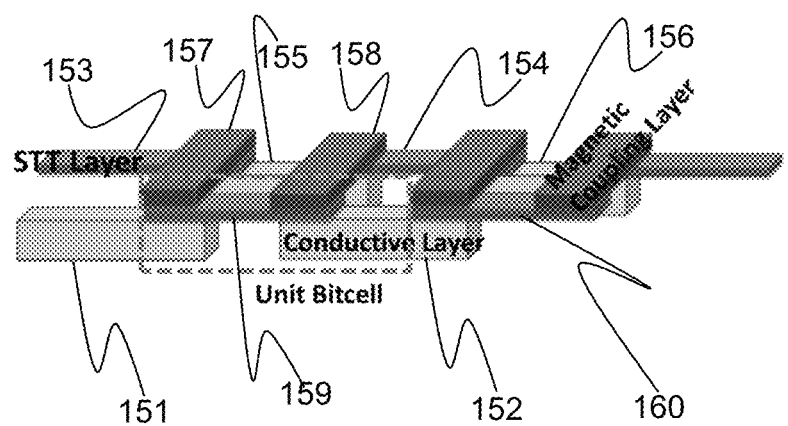
FIG. 15 is a 3D view of lateral chainlink memory, highlighting different layers and unit bitcell.

The results of the simulation are given below in FIG. 14. Importantly, all device structures are exactly the same shape. The bitcell links, branch link, and mux are all straight lines of metal here. Again, with this structure, the preferential domain wall pinning locations are formed purely by the overlap of two devices and not patterned changes in shape. The function of each only becomes apparent given the circuit and layout topology (i.e., how each element is placed relative to other elements and how they are clocked). This trait is unique to chainlink memory systems. The bitcell links below are 40 nm in length and 40 nm in width, and the branch and mux are both 100 nm long. The coupling sites (overlap between structures) are 20 nm long in each case. Magnetic layers 20 nm long are placed over the output of the mux to demonstrate clear state switching, and establish a preferential pinning location in the mux (as one does not inherently exist because it is a straight line of metal). Such layers would also have to be placed over the first "output" site in the branch link to establish a pinning site there. This was not done in the simulation because only one branch link output site was needed for observation. The current pulses applied had a width of 2 ns each. The bitcells received a 5.0 MA/cm$^2$ magnitude pulse (12 µA), while the branches and mux received 7.5 MA/cm$^2$ (18 µA) to compensate for the increased length.

Initially, current is applied to the bitcell links, which moves the domain walls in each into the output branch coupling sites. Once this state has been propagated in full, the current in the branch structures is turned on, moving the domain wall through the branch link and into the outermost coupling site. This propagates the magnetic state of the bitcell links down to the mux. From here, the direction of current through the mux determines which bitcell state—the left bitcell link's "down" state or the right bitcell link's "up" state—propagates to the read-out magnetic layers. In this simulation, the left bitcell link state is selected with an electron current flowing through the mux from left to right. The read-out layers become magnetized "down," and as anticipated, this state also overwrites the magnetization at the other input terminal of the mux and the output of the branch link that mux input is coupled to. The overwritten state in the branch link does not propagate further down the branch link; the other output site in that link, as well as its input which is coupled to a bitcell link, retain their magnetization. Only the application of a current in the opposite direction to which it would normally be applied in the branch link would allow this new erroneous magnetization state to further propagate by spin torque.

Lateral Chainlink Design

Figure 16:
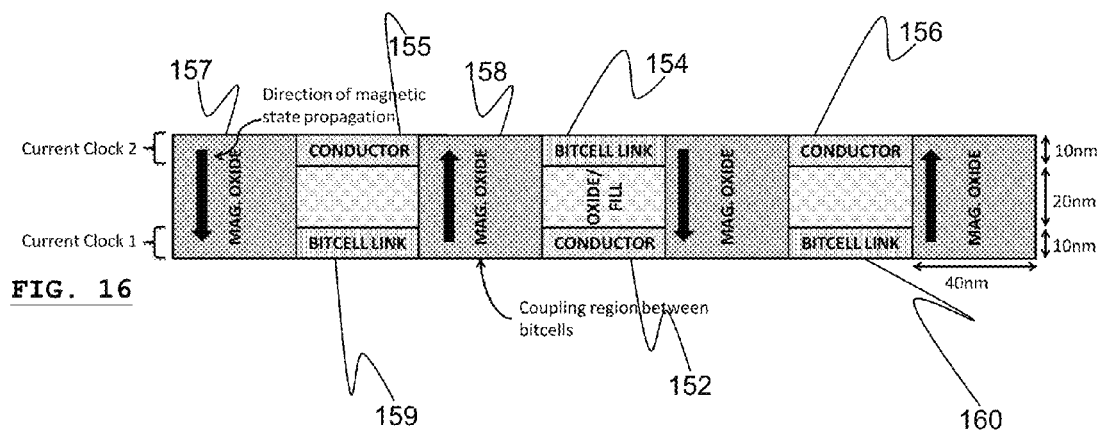
FIG. 16 is a top down view of a Lateral chainlink memory.
Figure 17:
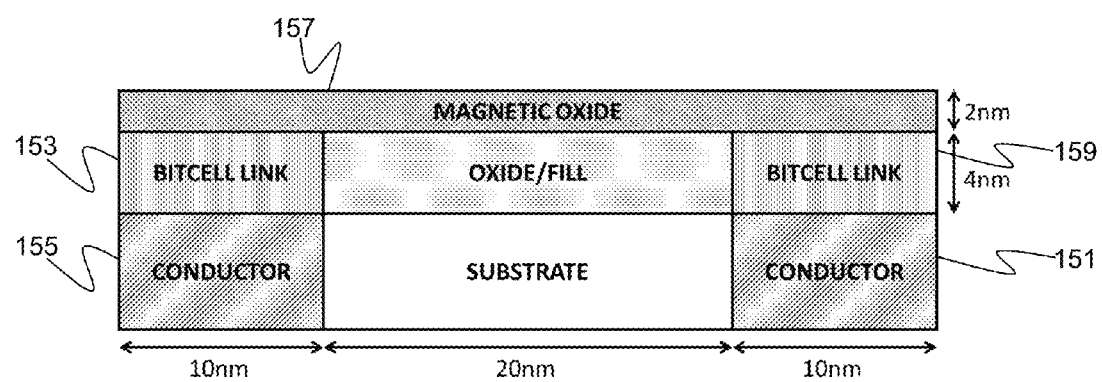
FIG. 17 shows a lateral chainlink memory (end-view inline with direction of bit propagation).
Figure 18:
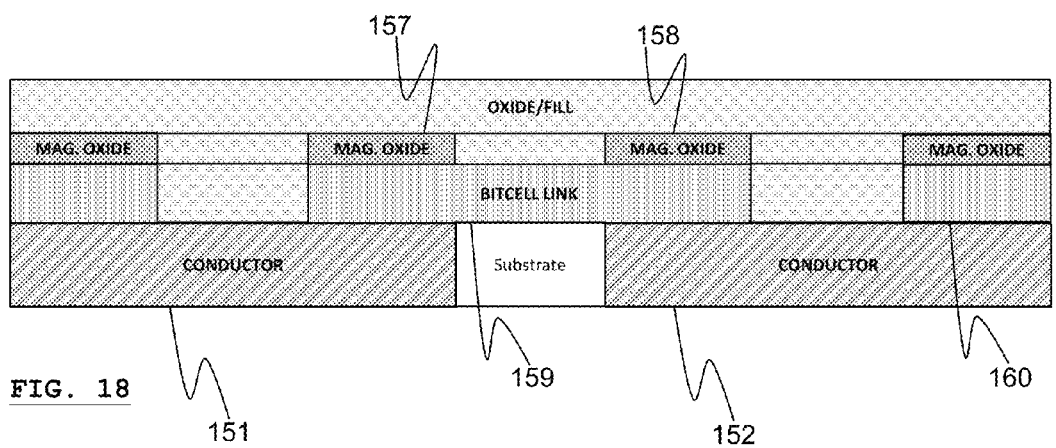
FIG. 18 shows a lateral chainlink memory (side view).

To avoid planarization of the deposited thin films, FIGS. 15-18 depict an alternative (lateral) chainlink design based on the use of lateral coupling between the tracks. This lateral chainlink memory would operate by propagating magnetic state from side to side as opposed to up and down (refer to FIG. 15). A top-down view of this structure is shown in FIG. 16. Two parallel tracks are preferably separated by a nonmagnetic insulating material (though a magnetic insulator may also be used). Each serial chain is functionally identical to what would be found in the vertical structure, magnetic bitcell links connected serially with conductors (wires) to allow current flow through the chain. An electrically insulating magnetic material to promote coupling between the two parallel tracks is then deposited and patterned over the bitcell links; the direction of magnetic state propagation is noted. When current clock 1 is activated, STT drives domain wall motion through the bitcell links in the lower track. When a wall reaches the magnetic insulator, it flips the material's magnetization which proceeds to couple to the magnetization on the other side of the material—the next bitcell link in the opposite track. When current clock 1 shuts off, current clock 2 activates and again pushes magnetic state to the next bitcell link on the opposite track. Therefore, the operation of this structure is functionally identical to what was previously described. Only the implementation has changed. A cross section of this design is shown in FIG. 17 and FIG. 18. It is important to note that the sizes shown do not reflect every possible size that can work.

Figure 19:
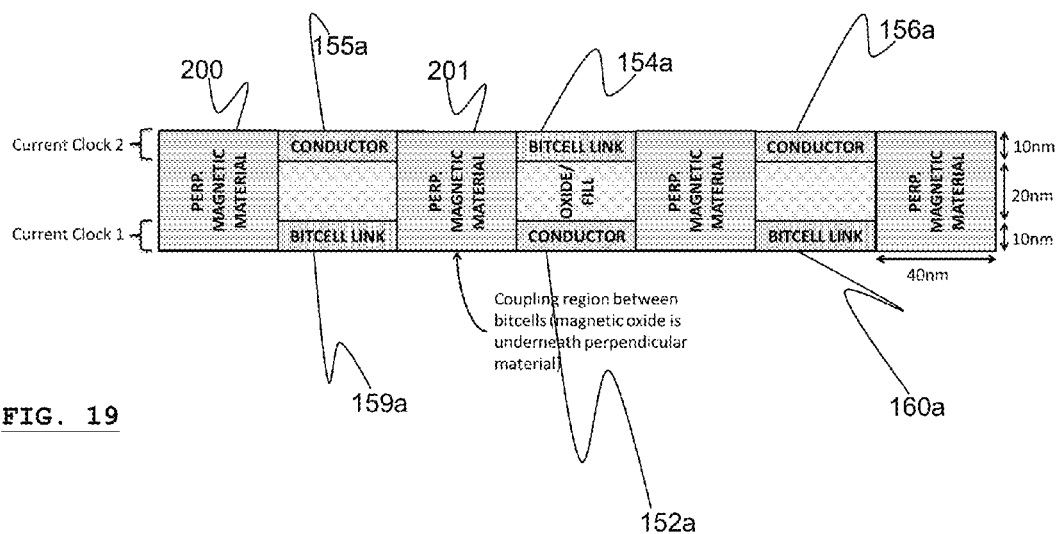
FIG. 19 shows a lateral chainlink memory with perpendicular coupling mediator (top down view).
Figure 20:
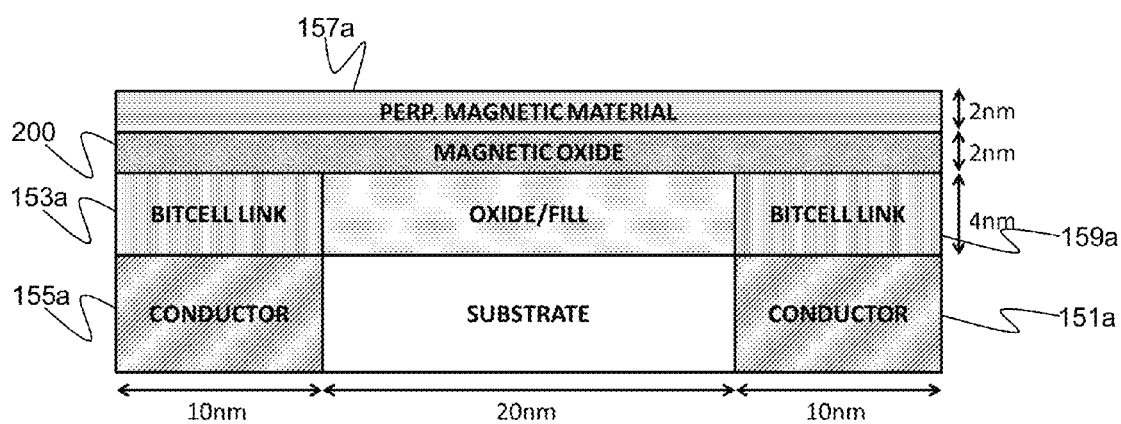
FIG. 20 shows a lateral chainlink memory with perpendicular coupling mediator (end-view inline with direction of bit propagation).
Figure 21:
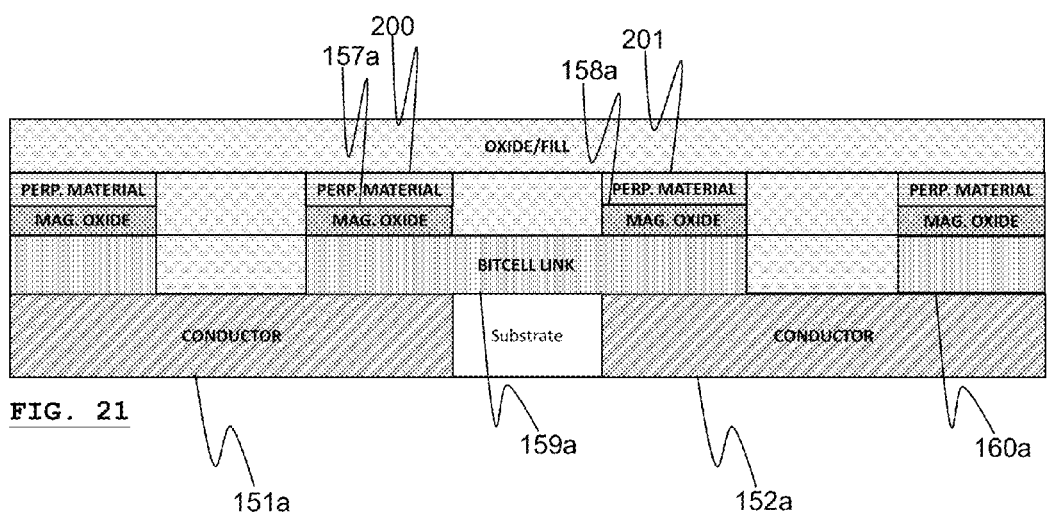
FIG. 21 shows a lateral chainlink memory with perpendicular coupling mediator (side view).
Figure 22:
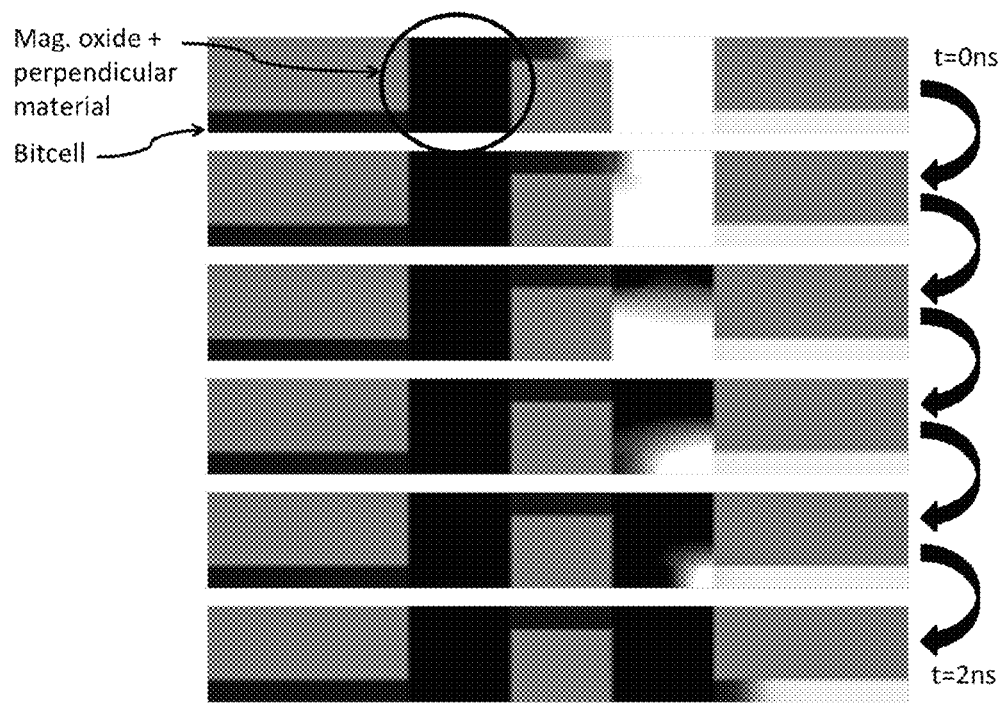
FIG. 22 shows a micromagnetic simulation of bit propagation in lateral chainlink memory (top-down view).

A related implementation also involves the deposition and patterning of a perpendicular magnetic material over the magnetic coupling layer (FIG. 19, FIG. 20). The purpose of this material is to "bias" the easy direction of the magnetic insulator, which by itself has no preferred axis in the perpendicular direction. This layer may also help in sizing the energy barrier and controlling or directing the domain wall motion. Of course, in-plane versions of this implementation may be constructed as well. Such in-plane versions may have coupling mediated by exchange, as shown in these drawings, or by magnetostatics alone. Here we choose to focus on perpendicular magnetic materials due to the high anisotropy (and therefore high stability) that is m1hat the wall area would have to become larger during coupling).

Three-Phase "Serpentine" Chainlink Example

Figure 23:
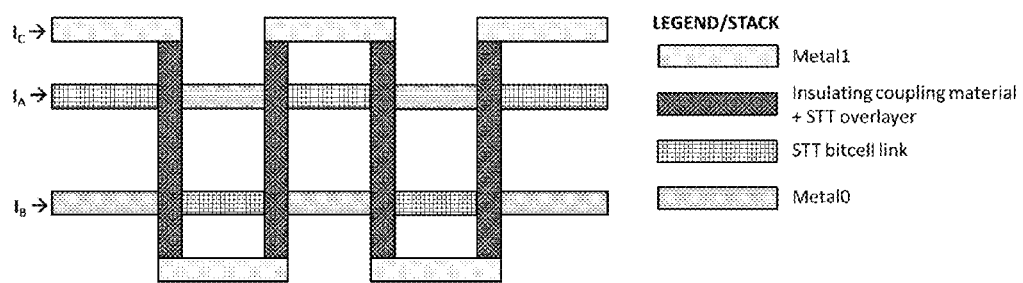
FIG. 23 shows a top-down illustration of a three-phase "serpentine" chainlink memory.

Serpentine chainlink is a modification to the lateral structure presented so far that combines elements of the vertical concept as well. In this design, the overlayer is formed by an insulating magnetic material (as before) with a perpendicular material suitable for STT on top (FIG. 23). The overlayer stripes that overlap the links and form the coupling sites are electrically-connected in a serpentine fashion, such that current "zig-zags" through on a unique phase. There are three phases of current clock used in this structure. The first, $I_A$, pushes domain walls in one link series into the output coupling site/overlayer; the second, $I_B$, does the same for the second link series; and the third, $I_C$, flows through the overlayer zig-zag and pushes all the bits to the next links.

Micromagnetic Simulation of Three-Phase "Serpentine Chainlink"

Figure 24:
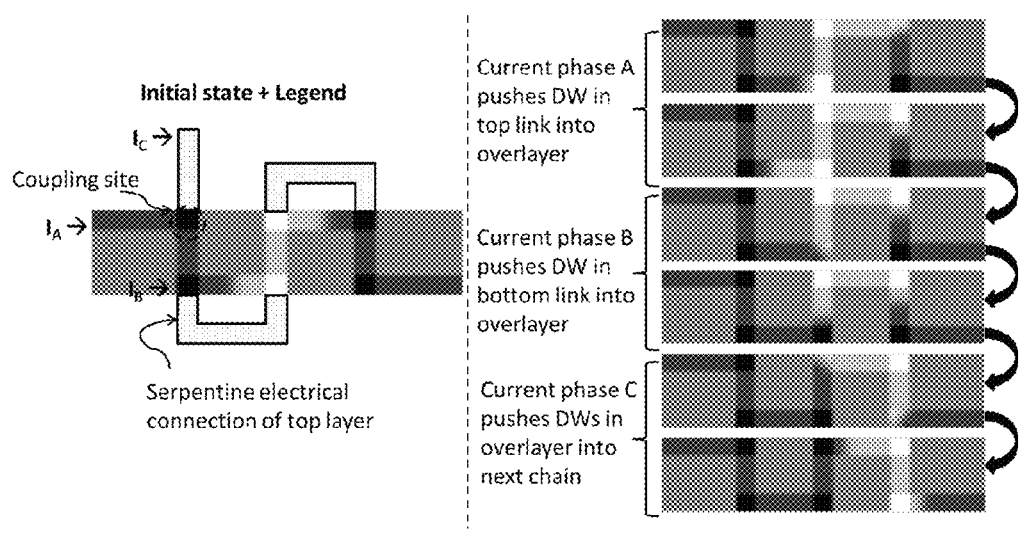
FIG. 24 shows a micromagnetic simulation demonstrating three-phase operation and bit propagation in serpentine chainlink memory (top-down view).

Micromagnetic simulation of serpentine chainlink is shown in FIG. 24. The bitcell links are assumed to be 50 nm long and 10 nm wide; the overlayer is also 10 nm wide, implying the total overlap area of a link and the overlayer is 10 nm by 10 nm. The gap between the series of links is assumed to be 20 nm wide. The magnetic state is initialized such that a domain wall rests in one link of each series. A current pulse is then applied to one series, which pushes the domain wall in that series into the overlayer by STT. Note that a stabilizing energy barrier is overcome at the location of the overlap. Once this current pulse shuts off, a second one turns on, moving the domain wall in the other series out into the overlayer. Finally, a third non-overlapping pulse is applied to the serpentine overlayer, which pushes one domain wall up and the other down due to the opposite direction of current flow. An energy barrier is again overcome in the overlap region. At the end of this entire process, both domain walls have shifted a single link.

Compact Model Development and SPICE Simulation

In order to enable easier development and use of the present invention, we consider here a basic circuit representation of chainlink memory. In an ideal sample and hold (S/H) circuit, the circuit is triggered by a clock signal. In a basic implementation, at every rising edge of the clock, an input voltage is sampled and its value held at the output node; the output node maintains this voltage until the next rising edge of the clock, where the input voltage is sampled again and the process repeated. In this chapter, the analogy of a chainlink bitcell link to a S/H circuit is made, and a Verilog-A compact model derived for SPICE simulation.

Chainlink Bitcell Link as Sample/Hold Element

A chainlink bitcell link behaves in much the same way as a S/H circuit. Once the current clock applied to a link is activated, the link is triggered to "sample" the magnetization of the input-coupling site and "hold" it at the output-coupling site. This representation encompasses the underlying dynamics of the link, where spin-transfer torque moves a domain wall from one end of the device to the other, programming the magnetization of the output in the direction of the input site magnetization. The S/H circuit analogy can be used to write a stable Verilog-A compact model suitable for simulation in SPICE and SPECTRE.

In equating the chainlink bitcell link to a S/H circuit, there are a few modifications that should be made to accurately describe the behavior. In particular, the delay of the sample appearing at the output as well as the time required for the output to fully transition must be specified according to the underlying physics of the bitcell link. Additionally, a threshold constraint must be incorporated such that the input magnetization only appears at the output if the current clock signal is of sufficient magnitude to move the domain wall.

In a one-dimensional approximation of domain wall motion under the influence of spin torque, the velocity of the domain wall can be calculated by solving Eqn. (8) with $\Delta E=0$ for $v_W$:

$$v_w = \frac{1}{1+\alpha^2}\left(\frac{g\mu_B P}{2eM_s}\right)J \qquad (12)$$

In this approximation, the velocity of the domain wall scales linearly with the current density. By specifying the geometry of the bitcell link in the compact model parameters, the current density can be calculated from the input current at every time point. A scaled form of Eqn. (12), where the velocity is made to match the results of more accurate micromagnetic simulations, is then used to set the speed at which the input magnetization appears at the output coupling site (the velocity at which the domain wall is traveling).

To determine the output transition time, it is necessary to scale Eqn. (12) based on micromagnetic simulation results, where the velocity of the domain wall inside the output-coupling site is measured as the output coupling site is fully programmed. It is worth noting that because of the different switching load in the coupling site compared to the connecting channel, the domain wall velocity in this region is not guaranteed to match the wall velocity in the channel that controls the time it takes for the input to appear at the output. In general, it is likely the wall velocity in the coupling site is slower than the wall velocity in the channel. In the Verilog-A model, the speed of the wall in the coupling site is reduced by a factor of two compared to the speed in the channel at the same current density, an approximation derived from micromagnetic simulation behavior.

Finally, micromagnetic simulation results incorporating the effects of thermal fluctuations can be performed to estimate the threshold current density required to move the domain wall and program the bitcell link. This empirical result is then incorporated into the model as a threshold check to ensure the link only operates with sufficient currents. Additionally, the electrical resistivity of the magnetic metal that forms the link is input to determine the total resistance of the link. This is used to gauge the power consumption of the bitcell links and the shift register as a whole.

Simulation in SPECTRE

Figure 25:
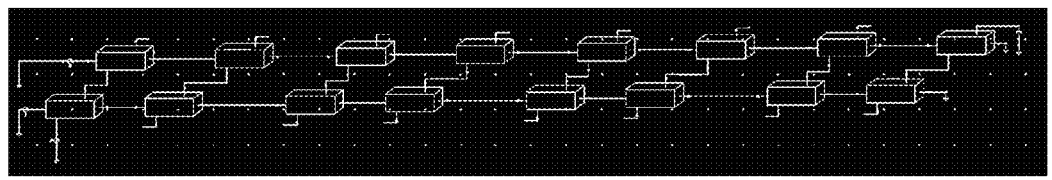
FIG. 25 shows a schematic of an 8-bit chainlink memory shift register.
Figure 26:
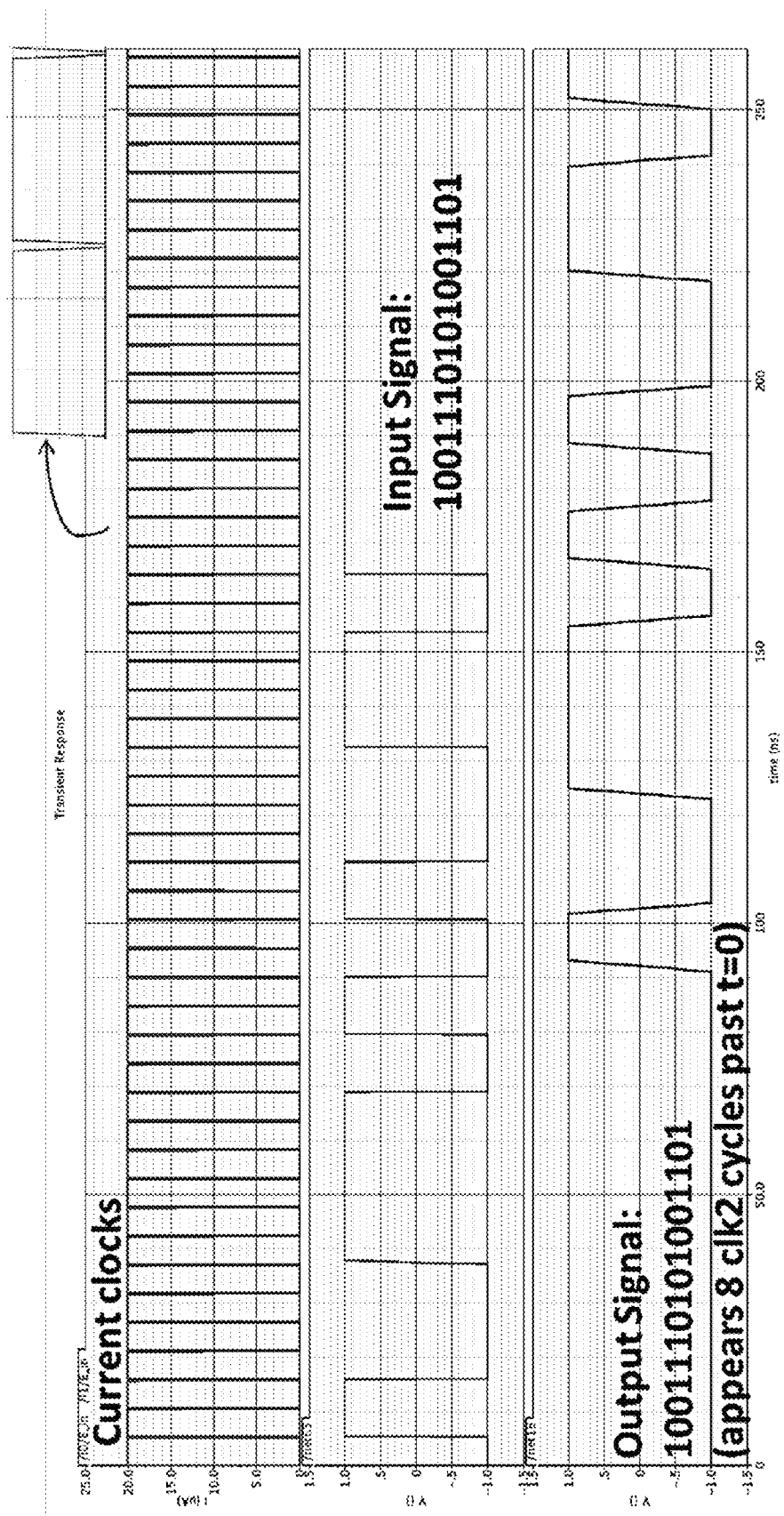
FIG. 26 shows waveforms depicting operation of the 8-bit chainlink shift register.

An initial test of the chainlink memory in SPECTRE is presented below, where FIG. 25 depicts the schematic representation of a 8-bit chainlink shift register and FIG. 26 the waveforms demonstrating its operation. The memory is written to by an ideal source that outputs +1 or −1 into the input magnetic coupling site of the first bitcell link in the chain, which corresponds to upward or downward magnetization, respectively. The state is read out across a "capacitor." Note that in this representation, we are essentially denoting the magnetization direction as a voltage equal to ±1V, and interfacing with the shift register directly. In reality, a write device would be used to write data into the shift register and a read sensor used to read state. In all simulations presented here, we define upward magnetization as a logic 1 and downward magnetization as a logic 0.

Initially, all magnetic state in the bitcells is set to logic 0. Out of phase current sources are used to clock the structure, where one source provides the current for the bottom set of links and the second source provides current for the top set of links. Long pulsewidths (5 ns) and high currents (20 µA) are used here just to ensure switching and demonstrate the basics of operation. Beginning shortly after t=0, the input source writes the signal 1001110101001101 sequentially, with each new bit being written during a phase in which the current clock applied to the first bitcell is not active. Once this current clock goes high, the new bit is pushed to the output of the first bitcell, and propagated through the chain on subsequent pulses. Because there are eight links connected per current clock, the first bit of the output should appear after eight clock cycles of the current clock connected to the top chain (clk2), where the output is taken. Indeed, after these eight cycles, the output begins to replicate the input signal. A new bit arrives at the output each clock pulse of clk2.

Loop Simulation

Figure 27:
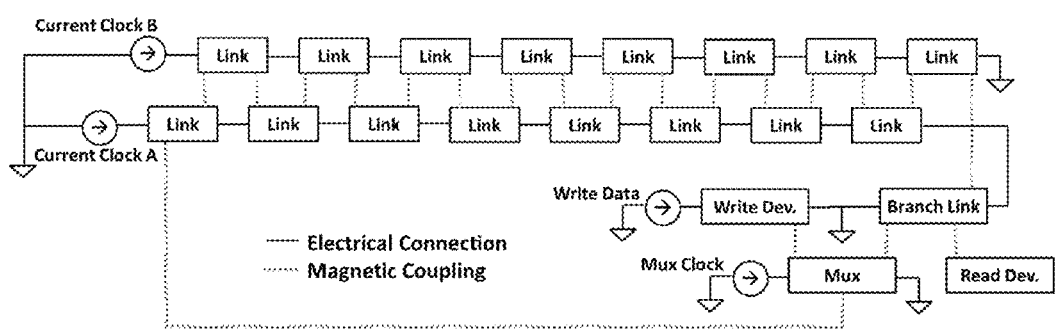
FIG. 27 shows a schematic of 8-bit loop structure.

As noted, one appealing aspect of chainlink memory is the ability to circulate data in a loop structure, eliminating the need for the reservoir region in racetrack memory. The simulation of a sample 8-bit loop structure is presented below in FIG. 27 and FIG. 28. In this representative loop, data is written into the chain by a multiplexer. This mux, as described earlier, takes as input two magnetization states and, given the direction of the input current, propagates one of these magnetic states to its output coupling site. In this simulation, an initial positive current pulse is used to select the first input, which is an ideal write source. After eight bits are written into the chain, the direction of the current through the mux is reversed, signaling the mux to select the magnetization at its second input. The second input to the mux is the output of the chain put through a branch link. The branch link, as previously noted, propagates its input magnetization state to two output coupling sites. One of these output-coupling sites is the second input to the mux; the other is unused in this simulation, but may be used to read the state in the chain if desired. This branch link is required because (as noted earlier) the mux has the potential to overwrite the magnetization state of the unselected input, which is undesirable. The magnetization state of the output bitcell is essentially buffered through the branch link.

Figure 28:
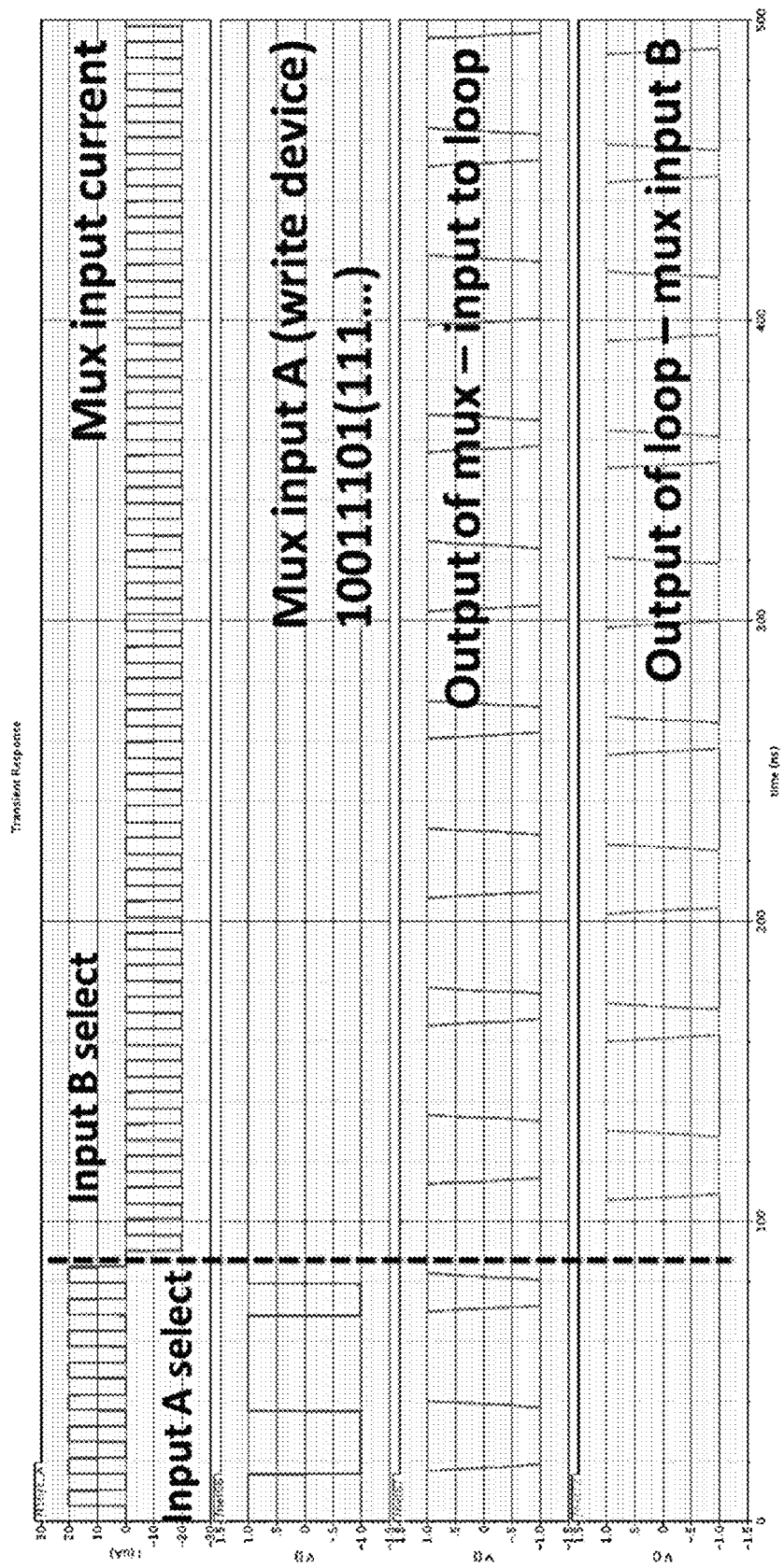
FIG. 28 shows simulation waveforms of 8-bit loop structure.

When the current through the mux is activated at this point in the simulation, the output of the chain is selected and fed back into the start of the chain. This leads to the circulation of the data in the chain, as shown in FIG. 28. The initial bits written into the chain by the ideal write device continue to propagate. In this simulation, the links were assumed to be 10 nm wide and 4 nm thick (the same dimensions given for the lateral chainlink design). The current pulses applied to the bitcells were 3 µA in amplitude and 5 ns in width. For a magnetic material with resistivity equal to $20 \times 10^{-8}$ Ωm, a bitcell 60 nm long and with the dimensions given has a resistance of 300Ω. The energy dissipated during a pulse of current through the links to shift the data by one position is then $(3 \mu A)^2$ (300 Ω/bitcell) (8 bitcells) (5 ns)=0.1 fJ.

Logic with Chainlink Devices

Figure 29:
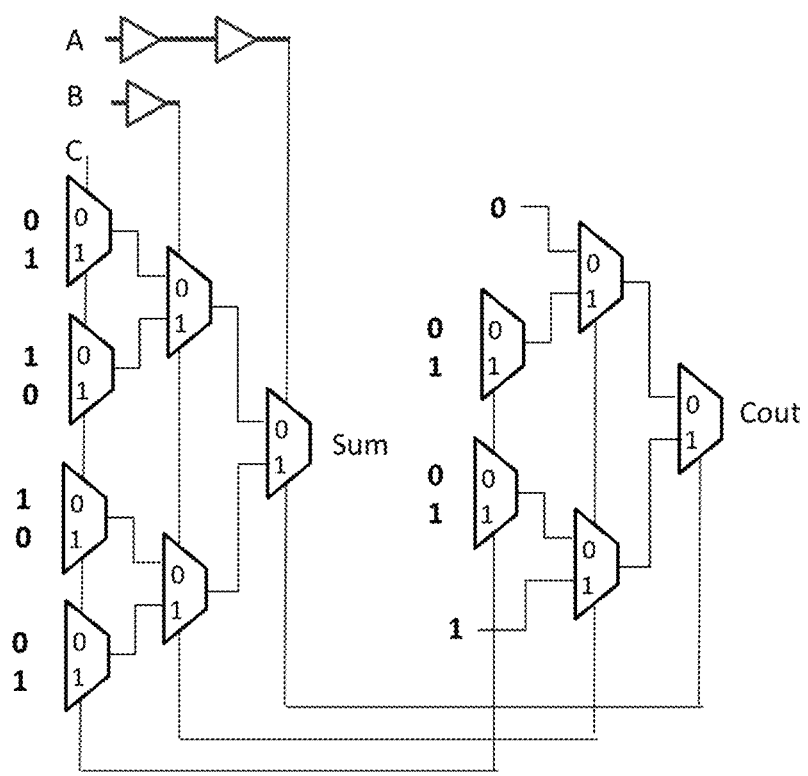
FIG. 29 shows a full adder composed of chainlink devices.

The chainlink array periphery devices can not only implement memory addressing, but can also implement random logic. Shannon decomposition can be used to map a logic function onto a tree of mux links. The leaf mux links can have one or more of the input coupling sites have pinned magnetization much like a write link. The resulting logic gate is an all magnetic look-up table. The input logic values are clocked current signals. Internal to the look-up table gate, no MTJ evaluation or current steering is performed, saving significant power. A read-link is placed in the final stage of the look-up table to convert the magnetization signal into a current signal. Current signals are necessary to drive the input of other look-up tables. A full adder built with chainlink logic uses two look-up tables and a total of twelve mux links or write links (FIG. 29). Assuming a 2 ns and 4 µA write current pulse through the 200 ohm links, just 76.8 aJ is consumed internal to the lookup table. The gate delay is 6 ns.

Logic block functionality is most efficiently implemented by many small interconnected look-up tables. A pure Shannon decomposition is not always area efficient. The select signals of the mux should be current signals, not magnetization signals; this suggests the use of read link devices for current steering. Alternatively, such current steering can be provided by mLogic gates, as disclosed in U.S. patent application Ser. No. 12/898,548 ("MAGNETIC SWITCHING CELLS AND METHODS OF MAKING AND OPERATING SAME"), filed Oct. 5, 2010 and incorporated by reference herein.

Useful Fabrication Materials

The field of current-induced domain wall motion is still an active one. New discoveries continue to be made regarding optimal materials for domain wall motion. As of the date of filing, the inventors see Co/Ni multilayer films as particularly promising for perpendicular chainlink structures. Other materials candidates include thin Co or CoFeB layers. In-plane versions may be composed of NiFe, CoFe, or CoFeB. A magnetic tunnel junction read sensor may be composed of a CoFeB/MgO/CoFeB stack for perpendicular or in-plane versions.

What we claim in this application is:

1. A race-free shift register, comprising:
   a plurality of odd-numbered storage elements, including at least $1^{st}$, $3^{rd}$, and $5^{th}$ storage elements, each capable of switching between first and second states;
   a plurality of even-numbered storage elements, including at least $2^{nd}$, $4^{th}$, and $6^{th}$ storage elements, each also capable of switching between said first and second states;
   each of said storage elements including an input-coupling region capable of assuming at least first and second states, a trapping region capable of assuming at least said first and second states, and at least one sensitization terminal configured to receive an activation excitation that causes said trapping region to assume the state of said input-coupling region;
   a plurality of odd-numbered coupling pathways, including at least $1^{st}$, $3^{rd}$, and $5^{th}$ coupling pathways, each positioned between a respective trapping region of an odd-numbered storage element and a respective input-coupling region of an even-numbered storage element and configured to couple said respective trapping region's state to said respective input-coupling region, such that the $1^{st}$ coupling pathway causes the state of the $2^{nd}$ storage element's input-coupling region to assume a state corresponding to the state of the $1^{st}$ storage element's trapping region, the $3^{rd}$ coupling pathway causes the state of the $4^{th}$ storage element's input-coupling region to assume a state corresponding to the state of the $3^{rd}$ storage element's trapping region, the $5^{th}$ coupling pathway causes the state of the $6^{th}$ storage element's input-coupling region to assume a state corresponding to the state of the $5^{th}$ storage element's trapping region;

a plurality of even-numbered coupling pathways, including at least $2^{nd}$, and $4^{th}$ coupling pathways, each positioned between a respective trapping region of an even-numbered storage element and a respective input-coupling region of an odd-numbered storage element and configured to couple said respective trapping region's state to said respective input-coupling region, such that the $2^{nd}$ coupling pathway causes the state of the $3^{rd}$ storage element's input-coupling region to assume a state corresponding to the state of the $2^{nd}$ storage element's trapping region, the $4^{th}$ coupling pathway causes the state of the $5^{th}$ storage element's input-coupling region to assume a state corresponding to the state of the $4^{th}$ storage element's trapping region;

an odd-numbered activation pathway, configured to simultaneously deliver a first activation excitation to the sensitization terminals of the odd-numbered storage elements; and, an even-numbered activation pathway, configured to simultaneously deliver a second activation excitation to the sensitization terminals of the even-numbered storage elements.

2. A shift register, as defined in claim 1, wherein the first and second activation excitations are non-overlapping.

3. A shift register, as defined in claim 1, wherein the even-numbered coupling pathways are non-inverting, such that the $3^{rd}$ storage element's input-coupling region assumes the state of the $2^{nd}$ storage element's trapping region, the $5^{th}$ storage element's input-coupling region assumes the state of the $4^{th}$ storage element's trapping region, and the $7^{th}$ storage element's input-coupling region assumes the state of the $6^{th}$ storage element's trapping region.

4. A shift register, as defined in claim 1, wherein the even-numbered coupling pathways are state-inverting, such that the $3^{rd}$ storage element's input-coupling region assumes the inverse of the state of the $2^{nd}$ storage element's trapping region, the $5^{th}$ storage element's input-coupling region assumes the inverse of the state of the $4^{th}$ storage element's trapping region, and the $7^{th}$ storage element's input-coupling region assumes the inverse of the state of the $6^{th}$ storage element's trapping region.

5. A shift register, as defined in claim 1, wherein the odd-numbered coupling pathways are non-inverting, such that the $2^{nd}$ storage element's input-coupling region assumes the state of the $1^{st}$ storage element's trapping region, the $4^{th}$ storage element's input-coupling region assumes the state of the $3^{rd}$ storage element's trapping region, the $6^{th}$ storage element's input-coupling region assumes the state of the $5^{th}$ storage element's trapping region.

6. A shift register, as defined in claim 1, wherein the odd-numbered coupling pathways are state-inverting, such that the $2^{nd}$ storage element's input-coupling region assumes the inverse of the state of the $1^{st}$ storage element's trapping region, the $4^{th}$ storage element's input-coupling region assumes the inverse of the state of the $3^{rd}$ storage element's trapping region, and the $6^{th}$ storage element's input-coupling region assumes the inverse of the state of the $5^{th}$ storage element's trapping region.

7. A shift register, as defined in claim 1, wherein the input-coupling and trapping region of each storage element are integrally formed.

8. A shift register, as defined in claim 7, wherein said input-coupling and trapping regions are integrally formed from a single material.

9. A shift register, as defined in claim 7, wherein said input-coupling and storage regions are integrally formed from a single class of materials, such as a magnetic multilayer.

10. A shift register, as defined in claim 2, wherein each coupling pathway comprises an output-coupling region and an insulator, wherein the output-coupling region abuts, and is integrally formed with, the trapping region whose state is to be coupled, and the insulator is disposed between said output-coupling region and the input-coupling region of the next-numbered storage element.

11. A shift register, as defined in claim 10, wherein the first state comprises a first principle direction of magnetization, and the second state comprises a second principle direction of magnetization that is detectably different from the first direction.

12. A shift register, as defined in claim 11, wherein the first and second directions are substantially opposite.

13. A shift register, as defined in claim 11, wherein the first and second directions are substantially orthogonal.

14. A shift register, as defined in claim 11, wherein said coupling is mostly magnetic exchange coupling.

15. A shift register, as defined in claim 11, wherein said coupling is mostly magnetostatic coupling.

16. A shift register, as defined in claim 11, wherein:
said odd-numbered storage elements are disposed linearly, in a first layer, with non-magnetic regions separating each linearly adjacent, odd-numbered storage element to form an odd-numbered storage element track;
said even-numbered storage elements are disposed linearly, and parallel to said odd-numbered element track, also in said first layer, and also with non-magnetic regions separating each linearly adjacent, even-numbered storage element to form an even-numbered storage element track;
a track separation region comprising an insulator is disposed laterally, in said first layer, between said odd-numbered and even-numbered storage element tracks;
each coupling pathway comprises, at least in part, a magnetic region that includes an insulator, disposed in a second layer above said first layer, and at least partially overlying each of said odd-numbered and even-numbered storage element tracks;
said odd-numbered activation pathway comprises, at least in part, a series of metal segments, disposed in a third layer below said first layer, said segments located beneath said odd-numbered storage element track; and,
said even-numbered activation pathway also comprises, at least in part, a series of metal segments, also disposed in the third layer, said segments located beneath said even-numbered storage element track.

17. A storage device, comprising at least:
a first series of at least four state-transitionable elements, said elements linked by a first active excitation pathway and transitionable in response to a first activation excitation conveyed via said pathway;
a second series of at least four state-transitionable elements, said elements linked by a second active excitation pathway and transitionable in response to a second activation excitation conveyed via said pathway;
a first passive state-coupling pathway, said pathway including at least four passive couplings, each positioned between a state-transitionable element in the first series and a respective state-transitionable element in the second series.

18. A storage device, as defined in claim 17, further comprising:
- a second passive state-coupling pathway, said pathway including at least four passive couplings, each positioned between a state-transitionable element in the second series and a respective state-transitionable element in the first series;
- said pathways configured such that:
    - in response to the first activation excitation, each of the state-transitionable elements in the first series assumes a state that is passively coupled by the respective coupling in the first state-coupling pathway, and
    - in response to the second activation excitation, each of the state-transitionable elements in the second series assumes a state that is passively coupled by the respective coupling in the second state-coupling pathway.

19. A storage device, as defined in claim 17, wherein each of said state-transitionable elements is transitionable at room temperature between at least first and second states, wherein said first state is characterized by a first principle direction of magnetization in a predefined region of the element, and wherein said second state is characterized by a second principle direction of magnetization in said predefined region that is detectably different from said first principle direction.

20. A storage device, as defined in claim 17, wherein each of said state-transitionable elements is transitionable at room temperature between at least first and second states, wherein said first state is characterized by the presence of a domain wall in the element, and wherein said second state is characterized by the absence of a domain wall in the element.

21. A storage device, as defined in claim 18, wherein the first activation excitation also causes any domain wall(s) in the first series of state-transitionable elements to disappear.

22. A storage device, as defined in claim 21, wherein the second activation excitation also causes any domain wall(s) in the second series of state-transitionable elements to disappear.

23. A storage device, as defined in claim 22, wherein said first and second activation excitations are at least partially non-overlapping.

24. A storage device, as defined in claim 17, wherein each of the state-transitionable elements includes a trapping region, bounded by one or more energy barrier(s), and configured to contain the movability of domain walls within the trapping region.

25. A storage device, as defined in claim 18, wherein each of said couplings comprises an insulating magnetic material.

26. A storage device, as defined in claim 18, wherein each of said couplings comprises a two-layer structure that includes an insulating magnetic material and a perpendicular magnetic material.

* * * * *